US010446600B2

(12) United States Patent
Sato et al.

(10) Patent No.: US 10,446,600 B2
(45) Date of Patent: Oct. 15, 2019

(54) IMAGING SYSTEM AND IMAGING DEVICE HAVING A RANDOM OPTICAL FILTER ARRAY

(71) Applicant: Panasonic Intellectual Property Management Co., Ltd., Osaka (JP)

(72) Inventors: Satoshi Sato, Kyoto (JP); Hisashi Watanabe, Osaka (JP); Takeo Azuma, Kyoto (JP); Kunio Nobori, Osaka (JP); Nobuhiko Wakai, Osaka (JP); Takamasa Ando, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/915,111

(22) Filed: Mar. 8, 2018

(65) Prior Publication Data

US 2018/0286906 A1  Oct. 4, 2018

(30) Foreign Application Priority Data

Mar. 29, 2017 (JP) ................................ 2017-066108

(51) Int. Cl.
*H01L 27/146* (2006.01)
*H04N 5/369* (2011.01)
(Continued)

(52) U.S. Cl.
CPC ...... *H01L 27/14627* (2013.01); *G06T 3/4015* (2013.01); *H01L 27/14621* (2013.01);
(Continued)

(58) Field of Classification Search
CPC ........ H01L 27/14627; H01L 27/14645; H04N 5/332; G06T 3/4015
See application file for complete search history.

(56) References Cited

U.S. PATENT DOCUMENTS 5,151,790 A  9/1992 Takatori et al.
5,629,734 A  5/1997 Hamilton, Jr. et al.
(Continued)

FOREIGN PATENT DOCUMENTS

JP  2008-270423  11/2008
WO  2011/063311  5/2011

OTHER PUBLICATIONS

A novel compressive sensing approach to simultaneously acquire color and near-infrared images on a single sensor, May 2013.*
(Continued)

*Primary Examiner* — Ahmed A Berhan
(74) *Attorney, Agent, or Firm* — Wenderoth, Lind & Ponack, L.L.P.

(57) ABSTRACT

An imaging system serving as an image generation device is provided with: a random color filter array that has a plurality of concave lenses and a plurality of color filters having different transmission characteristics; a photodiode that receives light that has passed through the random color filter array; an AD converter that converts the light received by the photodiode into digital data; and a color image generation circuit that generates an image using the digital data and modulation information of the random color filter array, in which the plurality of concave lenses are located between the plurality of color filters and the photodiode, or the plurality of color filters are located between the plurality of concave lenses and the photodiode.

13 Claims, 16 Drawing Sheets

(51) Int. Cl.
*H04N 9/04* (2006.01)
*G06T 3/40* (2006.01)
*H04N 5/225* (2006.01)
*H04N 9/67* (2006.01)
*H04N 9/65* (2006.01)

(52) U.S. Cl.
CPC ..... *H01L 27/14645* (2013.01); *H04N 5/2254* (2013.01); *H04N 5/3696* (2013.01); *H04N 9/045* (2013.01); *H04N 9/04555* (2018.08); *H04N 9/04557* (2018.08); *H04N 9/65* (2013.01); *H04N 9/67* (2013.01); *H04N 2209/045* (2013.01)

(56) References Cited

U.S. PATENT DOCUMENTS

| | | | |
|---|---|---|---|
| 6,737,719 B1* | 5/2004 | Yamamoto | H01L 27/14621 257/225 |
| 8,400,555 B1* | 3/2013 | Georgiev | H04N 5/23212 348/222.1 |
| 2009/0290198 A1* | 11/2009 | Hamano | G02B 5/205 358/475 |
| 2015/0116531 A1 | 4/2015 | Sato et al. | |
| 2017/0070709 A1 | 3/2017 | Sato et al. | |

OTHER PUBLICATIONS

Leonid I. Rudin et al., "Nonlinear total variation based noise removal algorithms", Physica D, vol. 60, Nov. 1992, pp. 259-268.

Shunsuke Ono et al., "Decorrelated Vectorial Total Variation", IEEE Conference on Computer Vision and Pattern Recognition, Jun. 2014.

Jianwei Ma, "Improved Iterative Curvelet Thresholding for Compressed Sensing and Measurement", IEEE Transactions on Instrumentation and Measurement, vol. 60, No. 1, Jan. 2011, pp. 126-136.

Michal Aharon et al., "K-SVD: An Algorithm for Designing Overcomplete Dictionaries for Sparse Representation", IEEE Transactions on Signal Processing, vol. 54, No. 11, Nov. 2006, pp. 4311-4322.

* cited by examiner

FIG. 15A

| $y_1$ | $y_2$ | $y_3$ | $y_4$ |
|---|---|---|---|
| $y_5$ | $y_6$ | $y_7$ | $y_8$ |
| $y_9$ | $y_{10}$ | $y_{11}$ | $y_{12}$ |
| $y_{13}$ | $y_{14}$ | $y_{15}$ | $y_{16}$ |

FIG. 15B

| $r_1$ | $r_2$ | $r_3$ | $r_4$ |
|---|---|---|---|
| $r_5$ | $r_6$ | $r_7$ | $r_8$ |
| $r_9$ | $r_{10}$ | $r_{11}$ | $r_{12}$ |
| $r_{13}$ | $r_{14}$ | $r_{15}$ | $r_{16}$ |

FIG. 15C

| $g_1$ | $g_2$ | $g_3$ | $g_4$ |
|---|---|---|---|
| $g_5$ | $g_6$ | $g_7$ | $g_8$ |
| $g_9$ | $g_{10}$ | $g_{11}$ | $g_{12}$ |
| $g_{13}$ | $g_{14}$ | $g_{15}$ | $g_{16}$ |

FIG. 15D

| $b_1$ | $b_2$ | $b_3$ | $b_4$ |
|---|---|---|---|
| $b_5$ | $b_6$ | $b_7$ | $b_8$ |
| $b_9$ | $b_{10}$ | $b_{11}$ | $b_{12}$ |
| $b_{13}$ | $b_{14}$ | $b_{15}$ | $b_{16}$ |

PSNR = 38.61 [dB]

PSNR = 37.59 [dB]

FIG. 19

| $x_{1,1}$ | $x_{1,2}$ | $x_{1,3}$ | $x_{1,4}$ |
|---|---|---|---|
| $x_{1,5}$ | $x_{1,6}$ | $x_{1,7}$ | $x_{1,8}$ |
| $x_{1,9}$ | $x_{1,10}$ | $x_{1,11}$ | $x_{1,12}$ |
| $x_{1,13}$ | $x_{1,14}$ | $x_{1,15}$ | $x_{1,16}$ |

| $x_{2,1}$ | $x_{2,2}$ | $x_{2,3}$ | $x_{2,4}$ |
|---|---|---|---|
| $x_{2,5}$ | $x_{2,6}$ | $x_{2,7}$ | $x_{2,8}$ |
| $x_{2,9}$ | $x_{2,10}$ | $x_{2,11}$ | $x_{2,12}$ |
| $x_{2,13}$ | $x_{2,14}$ | $x_{2,15}$ | $x_{2,16}$ |

...

| $x_{M,1}$ | $x_{M,2}$ | $x_{M,3}$ | $x_{M,4}$ |
|---|---|---|---|
| $x_{M,5}$ | $x_{M,6}$ | $x_{M,7}$ | $x_{M,8}$ |
| $x_{M,9}$ | $x_{M,10}$ | $x_{M,11}$ | $x_{M,12}$ |
| $x_{M,13}$ | $x_{M,14}$ | $x_{M,15}$ | $x_{M,16}$ |

| R | G | R | G | R | G | R | G |
|---|---|---|---|---|---|---|---|
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |
| G | B | G | B | G | B | G | B |

IMAGING SYSTEM AND IMAGING DEVICE HAVING A RANDOM OPTICAL FILTER ARRAY

BACKGROUND

1. Technical Field

The present disclosure relates to an image generation device and the like in which a compressed sensing technique is used.

2. Description of the Related Art

In order to capture a color image, it is necessary to acquire information regarding the three different wavelength regions of red (R), green (G), and blue (B) that correspond to the three primary colors of light. There are color imaging devices that acquire information regarding R, G, and B using three image sensors. However, many color imaging devices are equipped with only one image sensor in order to reduce size and cost. Therefore, many color imaging devices acquire information regarding R, G, and B using one image sensor.

There is a conventionally known method in which information regarding one wavelength region from among R, G, and B is acquired for each pixel, and information regarding the three wavelength regions of R, G, and B is acquired for each pixel by carrying out processing referred to as demosaicing.

FIG. 21 is a schematic drawing depicting a widely used Bayer array (for example, the specification of U.S. Pat. No. 5,629,734). In a Bayer array, pixels for G, which is close to the visual characteristics of a human, take up ½ of all of the pixels, and pixels for R and B each take up ¼ of all of the pixels. Information regarding the three wavelength regions of R, G, and B is then acquired for all of the pixels by means of demosaicing processing.

Meanwhile, Japanese Unexamined Patent Application Publication (Translation of PCT Application) No. 2013-511924 discloses a technique in which demosaicing is carried out by arranging color filter elements in a random color pattern and applying a compressed sensing technique to a sample data set.

SUMMARY

However, in the methods of the specification of U.S. Pat. No. 5,629,734 and Japanese Unexamined Patent Application Publication (Translation of PCT Application) No. 2013-511924, only information regarding one wavelength region from among R, G, and B is acquired in each pixel of an image sensor. Therefore, the resolution of the color image subsequent to demosaicing may decline and artifacts referred to as false color may occur.

One non-limiting exemplary aspect provides an image generation device that is capable of generating an appropriate image with a decline in resolution being suppressed. Furthermore, one non-limiting exemplary aspect of the present disclosure provides an imaging device that is used for generating an appropriate image. Additional benefits and advantages of the aspects of the present disclosure will become apparent from the present specification and drawings. The benefits and/or advantages may be individually provided by the various aspects and features disclosed in the present specification and drawings, and need not all be necessary in order to obtain one or more of the same.

In one general aspect, the techniques disclosed here feature an image generation device provided with: a random optical filter array that has a plurality of concave lenses and a plurality of optical filters having different transmission characteristics; a photodiode that receives light that has passed through the random optical filter array; an AD converter that converts the light received by the photodiode into digital data; and a generation circuit that generates an image using the digital data and modulation information of the random optical filter array, in which the plurality of concave lenses are located between the plurality of types of optical filters and the photodiode, or the plurality of optical filters are located between the plurality of concave lenses and the photodiode.

General or specific aspects of the aforementioned may be implemented using a system, a method, a computer program, and a computer-readable recording medium, or may be realized using a combination of a device, a system, a method, a computer program, and a computer-readable recording medium. The computer-readable recording medium includes a nonvolatile recording medium such as a compact disc-read only memory (CD-ROM), for example.

According to the present disclosure, a decline in resolution can be suppressed and an appropriate image can be generated. Additional benefits and advantages of the aspects of the present disclosure will become apparent from the present specification and drawings. The benefits and/or advantages may be individually provided by the various aspects and features disclosed in the present specification and drawings, and need not all be necessary in order to obtain one or more of the same.

BRIEF DESCRIPTION OF THE DRAWINGS

FIGS. 15A to 15D are schematic drawings depicting a modulated image and generated images in a case where the number of pixels of an imaging sensor is N=16;

FIG. 19 is a schematic drawing depicting a generated image (a multi-band image) in a case where the number of pixels of an imaging sensor is N=16;

Figure 1:
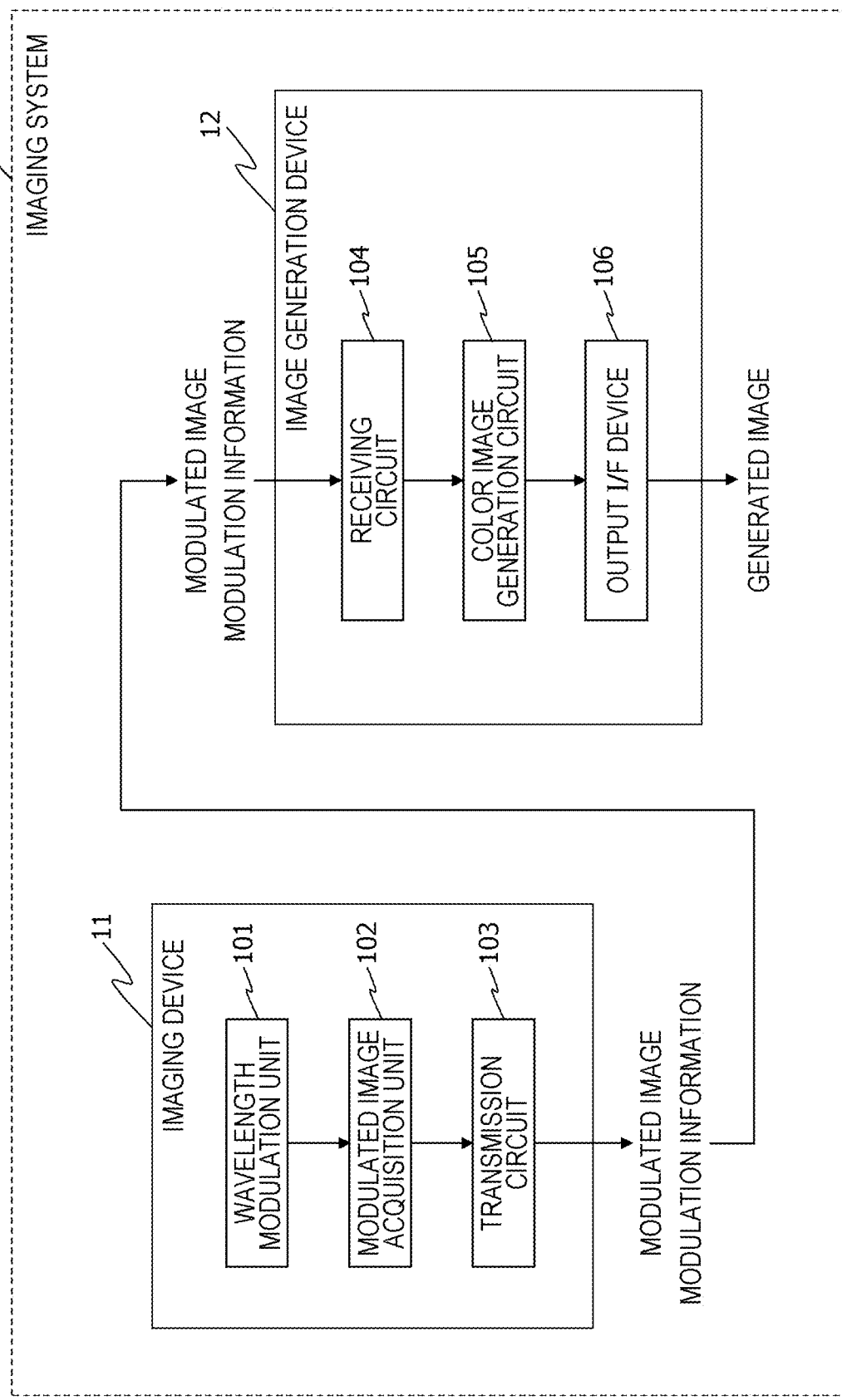
FIG. 1 is a schematic drawing depicting a configuration of an imaging system according to embodiment 1.

DETAILED DESCRIPTION (Findings Forming the Basis for the Present Disclosure)

In technology described in the specification of U.S. Pat. No. 5,629,734 and Japanese Unexamined Patent Application Publication (Translation of PCT Application) No. 2013-511924, only information regarding any one of R (red), G (green), and B (blue) is acquired in one pixel. Therefore, the acquired information is not always sufficient, and there is a possibility that an appropriate image having a high resolution may not be generated.

In contrast, for example, information regarding each wavelength band of R, G, and B is mixed and given to each pixel, and this mixing of information is carried out randomly with respect to pixel groups, and therefore more information can be obtained from each pixel, and an appropriate image can be generated by means of a compressed sensing technique from the obtained information. It is useful for the random mixing to be realized in a pseudo manner with respect to pixel groups using few types of optical filters, such as a total of three types of color filters or the like including an R filter that primarily passes the R wavelength band, a G filter that primarily passes the G wavelength band, and a B filter that primarily passes the B wavelength band, for example. For instance, a random optical filter array is installed and imaging is carried out with the random optical filter array being configured by arranging light ray diverging units constituted by concave lenses or the like that cause incident parallel light beams to diverge without converging, and optical filters of relatively few types, on the optical path of light received by an imaging sensor. Thus, light that has passed through each optical filter is received in one pixel and also in nearby pixels due to the diverging of light in the light ray diverging units, and a large amount of information is given to each pixel; therefore, it can become possible to generate an appropriate image having a high resolution. In this way, different from conventional techniques in which color mixing is prevented by capturing only one of R, G, and B in a pixel, the technique according to the present disclosure is able to generate an image having a high resolution by using light ray diverging units to cause, for example, color mixing or the like to occur by means of the diverging of light. Hereinafter, an image generation device and the like according to the present disclosure will be described on the basis of the above findings.

An image generation device according to an aspect of the present disclosure is provided with: a random optical filter array that has a plurality of concave lenses and a plurality of optical filters having different transmission characteristics; a photodiode that receives light that has passed through the random optical filter array; an AD converter that converts the light received by the photodiode into digital data; and a generation circuit that generates an image using the digital data and modulation information of the random optical filter array, in which the plurality of concave lenses are located between the plurality of types of optical filters and the photodiode, or the plurality of optical filters are located between the plurality of concave lenses and the photodiode. Here, optical filters of the same type have the same wavelength characteristics pertaining to the relationship between the wavelength of light and light transmittance, and optical filters of mutually different types have different wavelength characteristics pertaining to the relationship between the wavelength of light and light transmittance. The concave lenses are located between the plurality of types of optical filters and the photodiode, or in front of the plurality of types of optical filters (that is, in front of a light-receiving surface that is a light-receiving region of the photodiode), and are arranged on an optical path along which light that has passed through an image forming optical system member such as a convex lens, for example, reaches the light-receiving surface. In other words, (1) the concave lenses are located between the plurality of types of optical filters and the photodiode, or (2) the concave lenses are arranged on an optical path along which light that has passed through an image forming optical system member such as a convex lens is incident on the plurality of types of optical filters, and the plurality of types of optical filters are located between the concave lenses and the photodiode. The modulation information of the random optical filter array is information relating to light transmittance in the random optical filter array, which has the plurality of optical filters arranged on an approximate plane and includes the plurality of concave lenses, and the light transmittance can change in accordance with the position on the plane and the wavelength of light. It should be noted that the modulation information relates also to a point-spread function corresponding to the plurality of concave lenses, and the point-spread function can change in accordance with the position on the plane.

Thus, light that passes through the plurality of types of optical filters, which have mutually different wavelength characteristics pertaining to the relationship between the wavelength of light and transmittance, diverges and is received by the photodiode, and the photodiode, which serves as each pixel, is able to acquire sufficient information; therefore, a decline in resolution can be suppressed and an appropriate image can be generated.

Furthermore, for example, one or more of a size, a refractive index, and a curvature that defines a concave surface of a lens may be mutually different in each of the plurality of concave lenses.

Due to this kind of plurality of mutually different concave lenses, the random optical filter array has mutually different point-spread functions at arbitrary positions where light of a plurality of wavelength bands passes through. Therefore, the point-spread functions are random rather than conforming with a simple rule, and a random optical filter array having sufficient randomness can be realized.

Furthermore, for example, the image generation device may be provided with a convex lens, the plurality of concave lenses may be located between the convex lens and the plurality of optical filters in a case where the plurality of optical filters are located between the plurality of concave lenses and the photodiode, and the plurality of concave lenses may cause light that has passed through the convex lens to diverge in such a way as to pass through the plurality of optical filters.

Thus, light that has passed through the convex lens passes is diverged by the concave lenses and thereby passes through the plurality of optical filters before reaching the photodiode, and therefore a large amount of information is given to the pixels.

Furthermore, for example, the plurality of optical filters may be a plurality of color filters, the random optical filter array may have the plurality of color filters randomly arranged therein, and the image generated by the generation circuit may be a color image.

Thus, light that has passed through each of a plurality of sets of color filters such as an R filter, a G filter, and a B filter arranged randomly, for example, is diverged by the concave lenses and thereby added in a photodiode group of nearby pixels, and an appropriate color image having a high resolution can be generated by means of a compressed sensing technique, for example, on the basis of the modulation information.

Furthermore, for example, the image generated by the generation circuit may be an image expressed by a signal in which a wavelength band of light is divided into four or more channels, in other words, a multi-band image.

Thus, a multi-band image having a high resolution can be generated. It should be noted that, for example, the random optical filter array may be configured including an optical filter that passes light of a wavelength band other than visible light.

Furthermore, for example, the generation circuit may generate the image using a compressed sensing technique. The image can be appropriately generated by means of this compressed sensing.

Furthermore, an imaging device according to an aspect of the present disclosure is provided with: a random optical filter array that has a plurality of concave lenses and a plurality of optical filters having different transmission characteristics; a photodiode that receives light that has passed through the random optical filter array; and an AD converter that converts the light received by the photodiode into digital data, in which the plurality of concave lenses are located between the plurality of optical filters and the photodiode, or the plurality of optical filters are located between the plurality of concave lenses and the photodiode.

Thus, light that passes through the plurality of optical filters, which have mutually different wavelength characteristics pertaining to the relationship between the wavelength of light and transmittance, diverges and is received by the photodiode, and it becomes possible for the photodiode serving as each pixel to acquire sufficient information. Therefore, an appropriate image having a relatively high resolution can be generated using information of each pixel.

It should be noted that various types of general or specific aspects hereof include combinations of one or more of a device, a system, a method, an integrated circuit, a computer program, a computer-readable recording medium, or the like.

Hereinafter, embodiments of an imaging system pertaining to an image generation device in the present disclosure will be described with reference to the drawings. The embodiments given here are all merely examples. Consequently, the numerical values, the shapes, the materials, the constituent elements, the arrangement and modes of connection of the constituent elements, the steps, the order of the steps, and the like given in the following embodiments are examples and are not restrictive. From among the constituent elements in the following embodiments, constituent elements that are not mentioned in the independent claims are constituent elements that may be optionally added. Furthermore, the drawings are schematic drawings and are not always depicted in an exact manner.

Embodiment 1

FIG. 1 depicts a configuration of an imaging system 10 according to the present embodiment. The imaging system 10 is provided with an imaging device 11 and an image generation device 12.

The imaging device 11 has a wavelength modulation unit 101, a modulated image acquisition unit 102, and a transmission circuit 103. Meanwhile, the image generation device 12 has a receiving circuit 104, a color image generation circuit 105, and an output I/F (interface) device 106. The imaging device 11 and the image generation device 12 may be integrated. It goes without saying that, in a case where the imaging device 11 and the image generation device 12 are integrated, the transmission circuit 103 and the receiving circuit 104 can be omitted.

(Imaging Device 11)

First, the imaging device 11 will be described with reference to FIG. 2.

Figure 2:
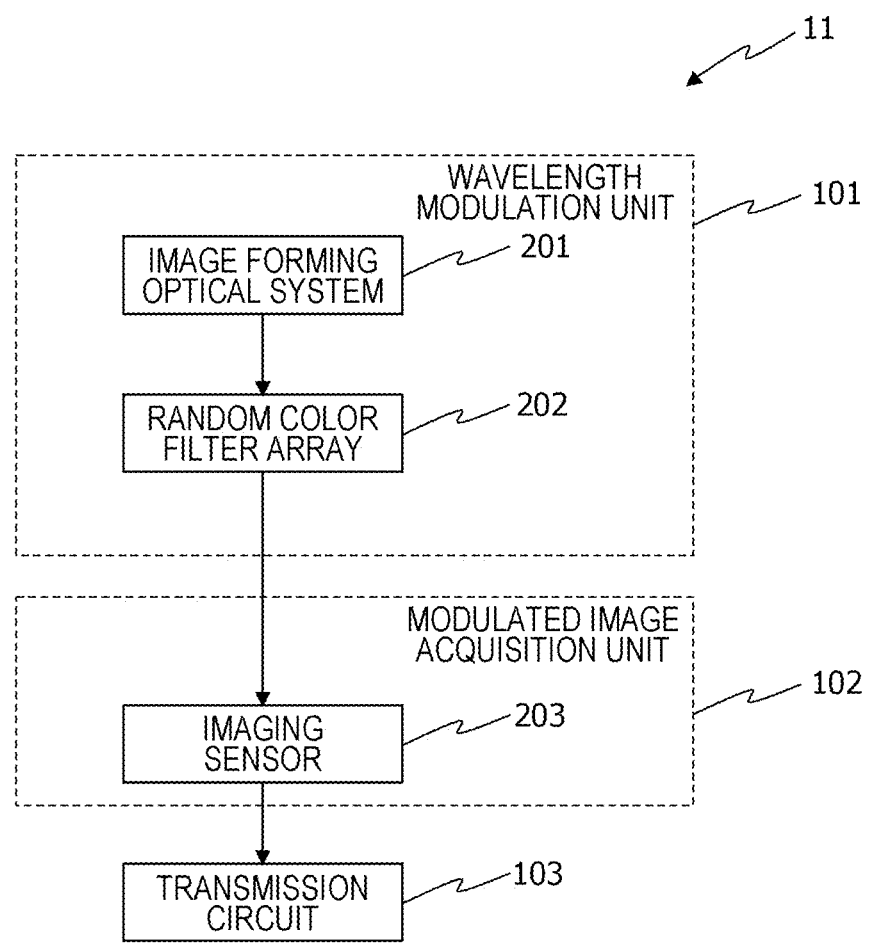
FIG. 2 is a drawing depicting details of a configuration of a wavelength modulation unit and a modulated image acquisition unit in the imaging system.

FIG. 2 depicts details of a configuration of the wavelength modulation unit 101 and the modulated image acquisition unit 102.

As depicted in FIG. 2, the wavelength modulation unit 101 corresponds to an image forming optical system 201 and a random color filter array 202. Furthermore, the modulated image acquisition unit 102 corresponds to an imaging sensor 203.

(Image Forming Optical System 201)

The image forming optical system 201 has, at least, one or more lenses and a lens position adjustment mechanism (neither of which are depicted). The one or more lenses collect light from an object for an image of an optical signal to be formed. The optical signal represents an image of the object. The lens position adjustment mechanism is, for example, a control circuit (a controller) that controls an actuator for adjusting the image formation position implemented by the lenses and the drive amount of the actuator. It should be noted that the lens position adjustment mechanism is not necessary in a case where the focal point of the one or more lenses is fixed. Furthermore, an image of an optical signal may be formed without using a lens, in a manner similar to a pinhole camera.

The image forming optical system 201 may be referred to as an optical system.

(Imaging Sensor 203)

Figure 3:
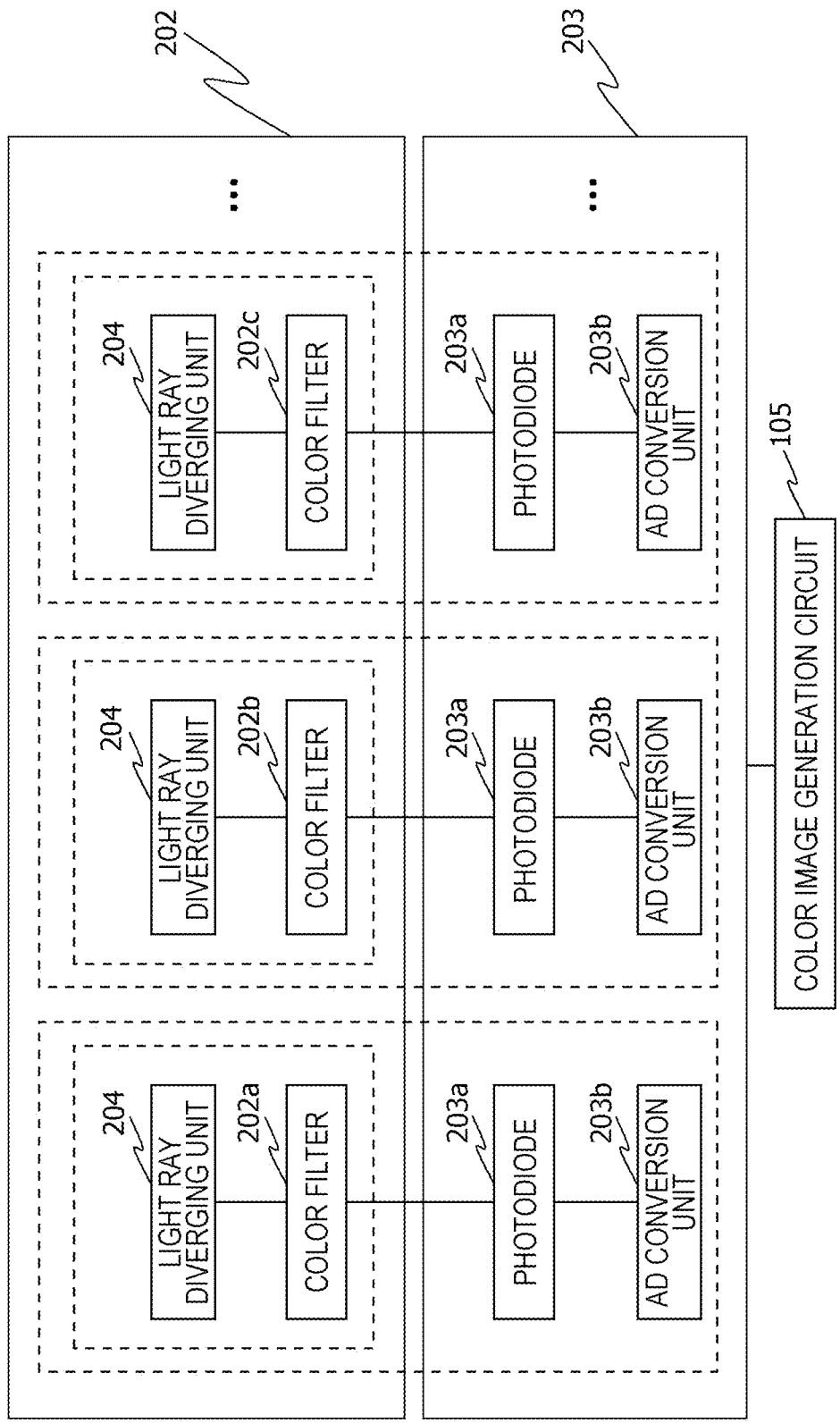
FIG. 3 is a schematic drawing depicting a configuration of a random color filter array and an imaging sensor in the imaging system.

FIG. 3 depicts an example of details of a configuration of the random color filter array 202 and the imaging sensor 203.

The imaging sensor 203 is configured including a plurality of photodiodes 203a and at least one AD conversion unit 203b.

The photodiodes 203a receive optical signals of which images have been formed by the image forming optical system 201, and the AD conversion unit 203b receives output signals of the photodiodes 203a and converts the output signals into digital signals. The digital signals represent a modulated image, which is an image that has been modulated for each pixel. In other words, the imaging sensor 203 generates a modulated image. The imaging sensor 203 is arranged at the focal length of the lenses.

The imaging sensor 203 includes a plurality of pixels that receive light collected by the optical system and output electrical signals. The pixels correspond to the photodiodes 203a. The plurality of photodiodes 203a of the imaging sensor 203 and the plurality of electrical signals have a one-to-one relationship.

(Random Color Filter Array 202)

The random color filter array 202 includes a plurality of types of color filters 202a to 202c and light ray diverging units 204. The random color filter array 202, for example, is provided with: a color filter assembly formed by the color filters 202a to 202c being arranged in plurality in mutually different positions on an approximate plane; and a plurality of the light ray diverging units 204. The random color filter array 202 is arranged in front of the light-receiving surfaces of the photodiodes 203a, that is, the random color filter array 202 is arranged on an optical path which light that has been output from the image forming optical system 201 follows until being incident on the imaging sensor 203, for example, between the light-exiting surface of the image forming optical system 201 and the light-receiving surfaces of the photodiodes 203a. In the random color filter array 202, the plurality of types of color filters 202a to 202c are arranged on the optical path which light that has been output from the image forming optical system 201 follows until being incident on the light-receiving surfaces of the photodiodes 203a. The light ray diverging units 204 are arranged between the image forming optical system 201 and the photodiodes 203a. The light ray diverging units 204 may be arranged next to the image forming optical system 201 and the plurality of types of color filters 202a to 202c, in other words, the light ray diverging units 204 may be arranged between the image forming optical system 201 and the plurality of types of color filters 202a to 202c. The light ray diverging units 204 may be arranged to the rear of the color filters 202a to 202c and in front of the imaging sensor 203, in other words, the light ray diverging units 204 may be arranged between the color filters 202a to 202c and the imaging sensor 203. Here, a description is given mainly using an example in which the light ray diverging units 204 are arranged in front of the plurality of types of color filters 202a to 202c, in other words, the light ray diverging units 204 are arranged between the image forming optical system 201 and the plurality of types of color filters 202a to 202c.

The light ray diverging units 204 are constituted by concave lenses, which are lenses that cause parallel light beams that are incident on the light ray diverging units 204 to diverge without converging. In the example of FIG. 3, the concave lenses constituting the light ray diverging units 204 are plano-concave lenses, the surfaces where light from the image forming optical system 201 is incident on the concave lenses have a concave surface shape, and the surfaces where light that has been incident on the concave lenses is emitted from the concave lenses have a planar surface shape.

The color filter 202a, the color filter 202b, and the color filter 202c are color filters of mutually different types (that is, wavelength characteristics pertaining to the relationship between the wavelength of light and transmittance). As an example, the color filter 202a of one type is an R filter that primarily passes the R wavelength band, the color filter 202b of another one type is a G filter that primarily passes the G wavelength band, and the color filter 202c of yet another one type is a B filter that primarily passes the B wavelength band.

The example of FIG. 3 depicts that one color filter from among the three types of color filters 202a to 202c is arranged corresponding to one of the photodiodes 203a in the random color filter array 202. The arrangement of the various types of color filters 202a to 202c on a two-dimensional plane (that is, a two-dimensional array) can be that of a Bayer array (see FIG. 21), for example.

The random color filter array 202 may be arranged in contact with the light-receiving surface of the imaging sensor 203. The random color filter array 202 may be arranged in front of the imaging sensor 203, spaced apart from the front surface; that is, the random color filter array 202 may be arranged at the light-receiving surface side of the imaging sensor 203 without being in contact with the light-receiving surface of the imaging sensor 203. In this case, the distance between the random color filter array 202 and the light-receiving surface is less than the distance between the random color filter array 202 and the surface on the opposite side of the imaging sensor 203 to the light-receiving surface. It should be noted that, in the present embodiment, the color filters 202a to 202c included in the random color filter array 202 are arranged at the light-receiving surface side of the imaging sensor 203 without being in contact with the light-receiving surface of the imaging sensor 203.

The random color filter array 202 is used for filtering light of a plurality of wavelength bands that is incident on the imaging sensor 203, and an image captured using the random color filter array 202 is referred to as a modulated image. The random color filter array 202 has different light transmittances and different point-spread functions at arbitrary positions where the light of the plurality of wavelength bands passes through. A "position" mentioned here means a position of a minute region having a fixed area. Assuming that the random color filter array 202 including the substantially planar-shaped color filters 202a to 202c has a substantially planar shape, the light transmittance and point-spread function may be different at each position of the minute regions on that plane. The light transmittance and point-spread function for each position such as the aforementioned are decided by the wavelength characteristics of the plurality of types of color filters 202a to 202c that make up the random color filter array 202, the arrangement of the random color filter array 202, and the configuration and arrangement of the light ray diverging units 204, and the light transmittance and point-spread function are referred to as modulation information. It should be noted that the configuration of the light ray diverging units 204 may mean a material. Furthermore, in a case where the light ray diverging units 204 are concave lenses, the configuration of the light ray diverging units 204 may be defined by at least one of the size of the concave lenses, the refractive index, and the curvature that defines the concave surfaces of the lenses, for example. The areas of the minute regions may be equal to the light-receiving areas of the photodiodes 203a of the imaging sensor 203, or may be smaller than the light-receiving areas, for example. It should be noted that the light transmittance may also be different depending on the passed wavelength (wavelength band).

The plurality of photodiodes 203a and the positions of the aforementioned plurality of minute regions pertaining to the random color filter array 202 may have a one-to-one relationship.

Further details of the random color filter array 202 will be described later on.

(Transmission Circuit 103)

The transmission circuit 103 transmits, to the image generation device 12, a modulated image captured by the imaging sensor 203, and modulation information that has been set corresponding to the random color filter array 202. The modulation information indicates a light transmittance and point-spread function as wavelength characteristics of each position. Either of wired communication and wireless communication may be carried out for the transmission.

It should be noted that, in the present embodiment, it is assumed that the imaging system 10 is provided with the transmission circuit 103 and the receiving circuit 104, and carries out processing with modulated images and modulation information being transmitted and received in near real time. However, the imaging system 10 may be provided with a storage device (for example, a hard disk drive) that saves modulated images and modulation information, and may carry out processing in non-real time.

(Image Generation Device 12)

Once again referring to FIG. 1, the receiving circuit 104, the color image generation circuit 105, and the output interface device 106 of the image generation device 12 will be described.

(Receiving Circuit 104)

The receiving circuit 104 receives a modulated image and modulation information that are output from the imaging device 11. Communication between the receiving circuit 104 and the transmission circuit 103 may be wired communication or wireless communication. It should be noted that, even if the transmission circuit 103 transmits a modulated image and modulation information by wired communication, the receiving circuit 104 may receive these items of information wirelessly by way of a device that converts the wired communication into wireless communication. The same is also true for the opposite thereof.

(Color Image Generation Circuit 105)

The color image generation circuit 105 generates a color image using a modulated image and modulation information received by the receiving circuit 104. Details of processing for generating a color image (color image generation processing) will be described later on. The color image generation circuit 105 sends the generated color image to the output interface device 106.

(Output Interface Device 106)

The output interface device 106 is a video output terminal or the like. The output interface device 106 outputs the color image to outside of the image generation device 12 as a digital signal or as an analog signal.

(Details of Random Color Filter Array 202)

Next, the random color filter array 202 will be described in more detail with reference to FIGS. 4 to 7.

Figure 4:
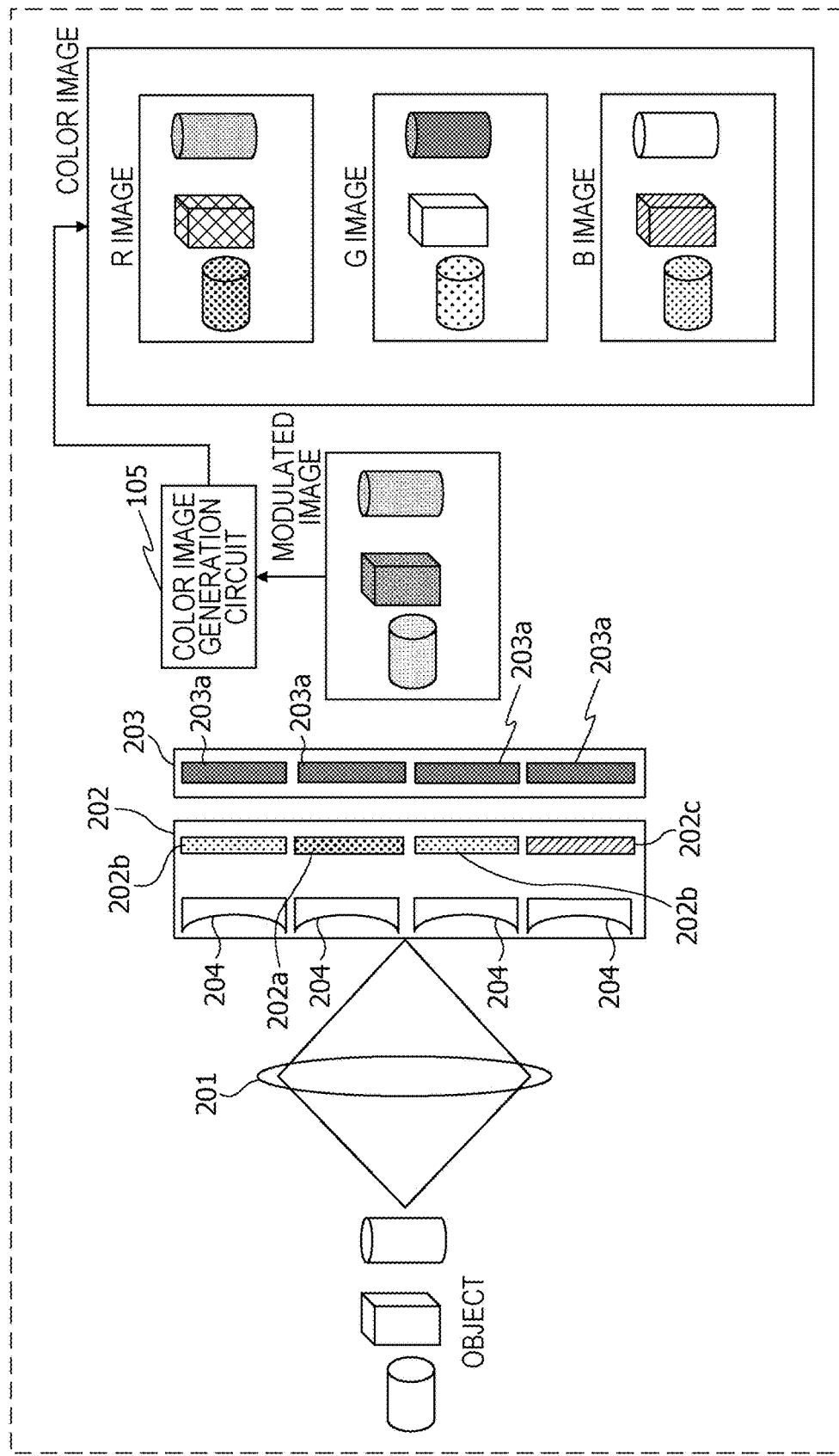
FIG. 4 is a schematic drawing of the imaging system including the random color filter array.

FIG. 4 is a schematic drawing of the imaging system 10 including the random color filter array 202.

As mentioned above, the random color filter array 202 has a light transmittance and point-spread function that may differ according to the position and according to the wavelength band. That is, at each of a plurality of arbitrary positions at which light of a plurality of wavelength bands is passed, the combinations of the light transmittance and point-spread function in each wavelength band are different from each other. In order to realize optical characteristics such as these, the random color filter array 202 of the present embodiment has: the plurality of types of color filters 202a to 202c, which have mutually different light transmittances that correspond to wavelength bands of light; and the plurality of light ray diverging units 204. Furthermore, the types of the color filters arranged in each position may be different in the random color filter array 202. In other words, color filters of mutually different types can be arranged in each position corresponding to the mutually near plurality of photodiodes 203a. The color filters 202a to 202c may be arranged regularly as in a conventional Bayer array (see FIG. 21) or may be arranged randomly. It should be noted that the color filters may partially overlap with each other when viewed from the front of the photodiodes 203a in the imaging sensor 203; however, a decrease in the amount of light received by the photodiodes 203a can be suppressed by the color filters not overlapping with each other, as in the example of FIG. 4.

In FIG. 4, an example is given in which the random color filter array 202 includes the three types of color filters 202a to 202c with one color filter corresponding to one photodiode 203a; however, it should be noted that this is merely an example, and the number of types of the color filters is not restricted to three, and the number of color filters arranged corresponding to one photodiode 203a is also not restricted to one.

Figure 5:
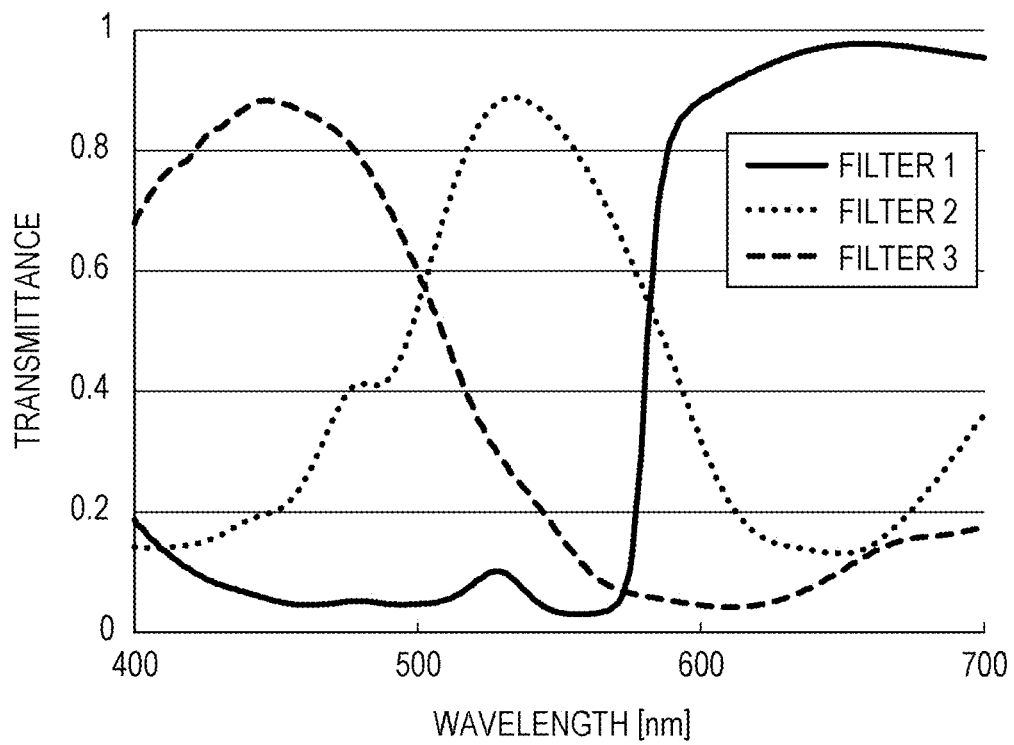
FIG. 5 is a drawing depicting transmittance as a wavelength characteristic of three types of filters according to an embodiment.

FIG. 5 is a drawing depicting light transmittance as wavelength characteristics of the three types of color filters 202a to 202c. In the same drawing, filter 1 is the color filter 202a, filter 2 is the color filter 202b, and filter 3 is the color filter 202c.

The wavelength characteristics of the filters indicate the extent to which light that is incident on a filter is reflected, passed, or absorbed, in accordance with the wavelength. The sum total of reflected light, passed light, and absorbed light is equal to the incident light. The ratio between passed light and incident light is referred to as "transmittance". This transmittance is also called light transmittance. The ratio between absorbed light and incident light is referred to as "absorbance". Absorbance is obtained by subtracting the amount of reflected light and the amount of passed light from the amount of incident light and further dividing by the amount of incident light. FIG. 5 depicts the relationship between light transmittance and the wavelength of light in each filter.

Figure 6:
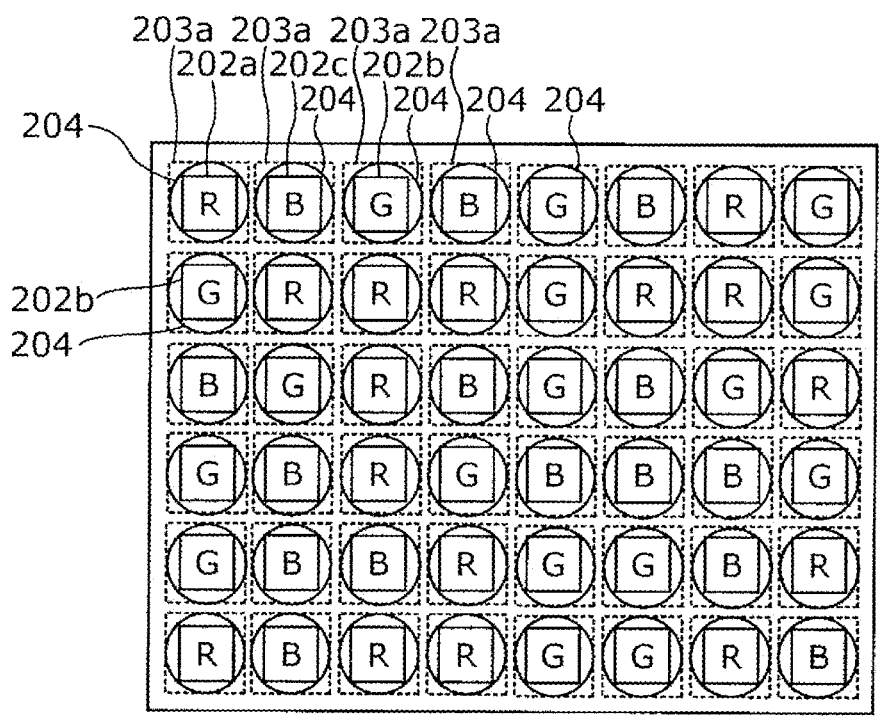
FIG. 6 is a schematic drawing depicting an arrangement on a two-dimensional plane of the random color filter array, which is configured of concave lenses and the three types of filters, and the imaging sensor.
Figure 7:
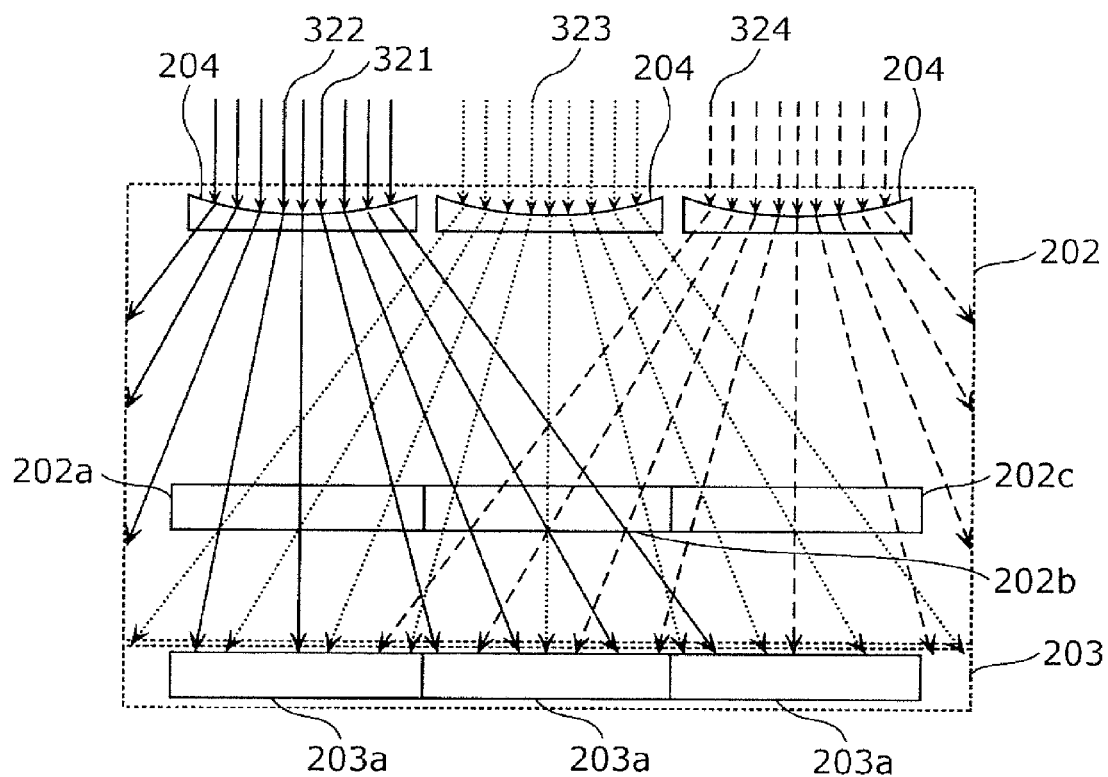
FIG. 7 is a schematic drawing depicting a cross section of the random color filter array, which is configured of the concave lenses and the three types of filters, and the imaging sensor.

FIGS. 6 and 7 are schematic drawings of the random color filter array 202 configured of the light ray diverging units 204, which are constituted by concave lenses, and the three types of color filters 202a to 202c. FIG. 6 depicts the arrangement on a two-dimensional plane of the concave lenses constituting the light ray diverging units 204 in the random color filter array 202, the color filters, and the photodiodes 203a of the imaging sensor 203. This two-dimensional plane is a plane that is parallel to the light-receiving surface of the imaging sensor 203, for example. FIG. 6 depicts an example in which the color filters 202a, 202b, and 202c are represented by R, G, and B, respectively, and the color filters 202a to 202c are arranged randomly. Methods for realizing a random arrangement are disclosed in Japanese Unexamined Patent Application Publication (Translation of PCT Application) No. 2013-511924, Japanese Patent No. 5054856, and Japanese Patent No. 5095040, for example. Furthermore, FIG. 6 depicts an example in which the outer periphery of the concave lenses constituting the light ray diverging units 204 is a circular shape. FIG. 7 depicts a cross section of the random color filter array 202 and the imaging sensor 203. In the random color filter array 202, the light ray diverging units 204 are constituted by concave lenses that cause incident light rays to diverge, and can be realized by replacing microlenses, which are convex lenses conventionally provided corresponding to an imaging sensor, with concave lenses. It should be noted that conventional microlenses have the purpose of increasing the amount of light that is incident on the photodiodes of the imaging sensor by concentrating the incident light, and are therefore constituted by convex lenses. Meanwhile, the light ray diverging units 204 have the purpose of causing incident light to diverge in order to realize random sampling, and are therefore configured using concave lenses.

The concave lenses of the light ray diverging units 204 have a shape in which the front surface of the lens is recessed toward the center of the lens, for example. In the example of FIG. 7, the concave lenses constituting the light ray diverging units 204 are plano-concave lenses, the surfaces where light is incident on the concave lenses have a concave surface shape, and the surfaces where light that has been incident on the concave lenses is emitted from the concave lenses have a planar surface shape. The concave surfaces of the concave lenses of the light ray diverging units 204 have a shape that is similar to a portion of a spherical surface, for example. In a concave lens in which this concave surface has a shape that is similar to a portion of a spherical surface, the recessed section has a circular arc shape in a cross section passing through the optical axis of the lens, seen from an arbitrary direction perpendicular to the optical axis of the lens.

As depicted in FIG. 7, the three types of color filters 202a to 202c are arranged spaced apart from the imaging sensor 203, and light that has passed through the image forming optical system 201 is diverged by the light ray diverging units 204, passes through the three types of color filters 202a to 202c, and is received by the plurality of photodiodes 203a. Due to the diverging of light by the light ray diverging units 204, for example, in a case where first light and second light have passed through one color filter, a photodiode A included in the plurality of photodiodes 203a can receive the first light and a photodiode B included in the plurality of photodiodes 203a can receive the second light, and also one of the photodiodes 203a can receive third light that has passed through a color filter A included in the plurality of color filters included in the random color filter array 202 and fourth light that has passed through a color filter B included in the plurality of color filters.

Figure 8:
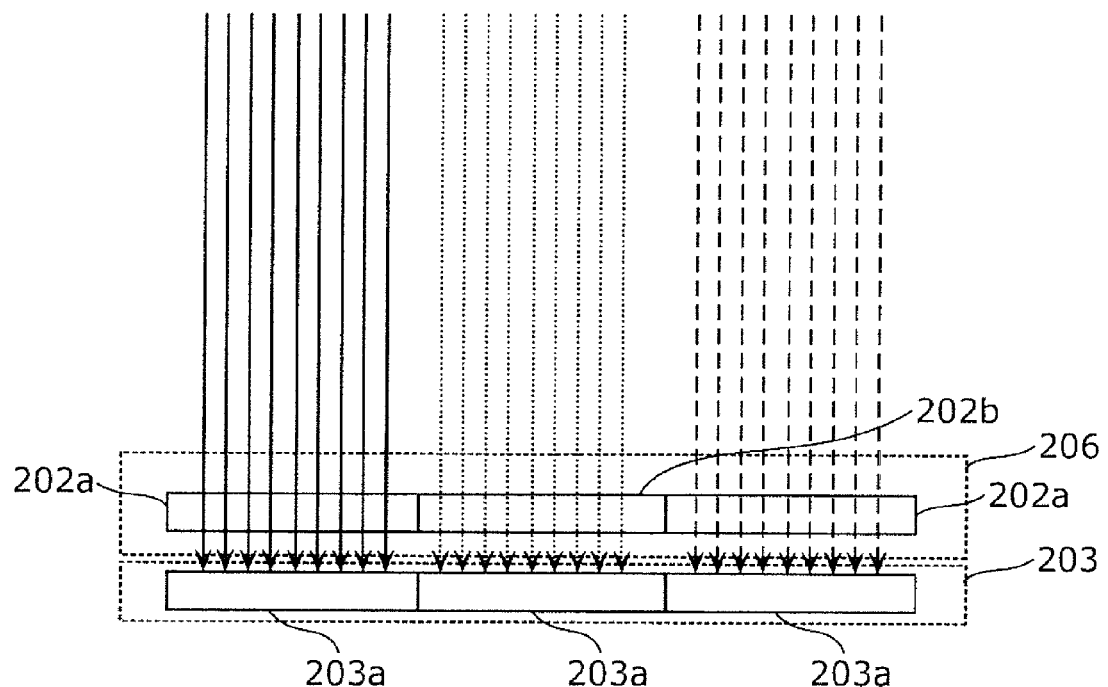
FIG. 8 is a schematic drawing of a color filter array in a conventional color imaging device.

FIG. 8 is a schematic drawing of a color filter array 206 of a Bayer array in a conventional color imaging device. Compared with the random color filter array 202 according to the present embodiment (see FIG. 7), the conventional color filter array 206 does not have the light ray diverging units 204. Furthermore, in order to prevent crosstalk between color filters, the conventional color filter array 206 is designed in such a way that light rays that have passed through one color filter (the color filter 202a or the like) forming part of the color filter array 206 are received by the same photodiode 203a as much as possible. This will be described hereinafter.

In FIG. 8, a color filter 202a in a first arrangement position that is an arrangement position at the left end corresponds to a photodiode 203a in a fourth arrangement position that is an arrangement position at the left end, a color filter 202b in a second arrangement position that is an arrangement position in the center corresponds to a photo-diode 203a in a fifth arrangement position that is an arrangement position in the center, and a color filter 202a in a third arrangement position that is an arrangement position at the right end corresponds to a photodiode 203a in a sixth arrangement position that is an arrangement position at the right end. In FIG. 8, the light rays indicated by solid lines pass through the color filter 202a in the first arrangement position, do not pass through the color filter 202b in the second arrangement position, and do not pass through the color filter 202a in the third arrangement position. The photodiode 203a in the fourth arrangement position corresponding to the color filter 202a in the first arrangement position receives the light rays indicated by the solid lines, the photodiode 203a in the fifth arrangement position corresponding to the color filter 202b in the second arrangement position does not receive the light rays indicated by the solid lines, and the photodiode 203a in the sixth arrangement position corresponding to the color filter 202a in the third arrangement position does not receive the light rays indicated by the solid lines. In FIG. 8, the light rays indicated by dotted lines do not pass through the color filter 202a in the first arrangement position, pass through the color filter 202b in the second arrangement position, and do not pass through the color filter 202a in the third arrangement position. The photodiode 203a in the fourth arrangement position corresponding to the color filter 202a in the first arrangement position does not receive the light rays indicated by the dotted lines, the photodiode 203a in the fifth arrangement position corresponding to the color filter 202b in the second arrangement position receives the light rays indicated by the dotted lines, and the photodiode 203a in the sixth arrangement position corresponding to the color filter 202a in the third arrangement position does not receive the light rays indicated by the dotted lines. In FIG. 8, the light rays indicated by dashed lines do not pass through the color filter 202a in the first arrangement position, do not pass through the color filter 202b in the second arrangement position, and pass through the color filter 202a in the third arrangement position. The photodiode 203a in the fourth arrangement position corresponding to the color filter 202a in the first arrangement position does not receive the light rays indicated by the dashed lines, the photodiode 203a in the fifth arrangement position corresponding to the color filter 202b in the second arrangement position does not receive the light rays indicated by the dashed lines, and the photodiode 203a in the sixth arrangement position corresponding to the color filter 202a in the third arrangement position receives the light rays indicated by the dashed lines. This completes the description of FIG. 8.

In the random color filter array 202 according to the present embodiment depicted in FIG. 7, for example, similar to the example of light indicated by the solid lines in FIG. 8, light 322 indicated by a solid line passes through the color filter 202a in the arrangement position at the left end in FIG. 7 and is received by the photodiode 203a in the arrangement position at the left end in FIG. 7; however, light 321 indicated by a solid line is diverged by a concave lens of a light ray diverging unit 204, passes through the color filter 202a in the arrangement position at the left end in FIG. 7, and is received by the photodiode 203a in the arrangement position in the center in FIG. 7, which is different from the example of light indicated by the solid lines in FIG. 8.

Furthermore, in FIG. 7, light 323 indicated by a dotted line is diverged by a concave lens of a light ray diverging unit 204, passes through the color filter 202b in the arrangement position in the center in FIG. 7, and is received by the photodiode 203a in the arrangement position at the left end in FIG. 7, which is different from the example of light indicated by the dotted lines in FIG. 8.

Furthermore, in FIG. 7, light 324 indicated by a dashed line is diverged by a concave lens of a light ray diverging unit 204, passes through the color filter 202b in the arrangement position in the center in FIG. 7, which is different from the example of light indicated by the dashed lines in FIG. 8, and is received by the photodiode 203a in the arrangement position at the left end in FIG. 7.

In this way, the random color filter array 202 of the present embodiment, as a result of having the light ray diverging units 204, causes light that has passed through color filters in a plurality of different positions to be received by one of the photodiodes 203a, and causes light that has passed through a color filter in the same position to be received by a plurality of the photodiodes 203a. That is, the random color filter array 202, as a result of having the light ray diverging units 204, has a light transmittance and point-spread function that differ according to the position and the wavelength of light, and sampling that is random both spatially and in terms of wavelength can therefore be realized.

It should be noted that FIG. 7 depicts an example in which concave lenses constituting the light ray diverging units 204 in the random color filter array 202 are arranged between the image forming optical system 201 and the color filters 202a to 202c, and concave lenses constituting the light ray diverging units 204 are not arranged between the color filters 202a to 202c and the photodiodes 203a.

A configuration may be implemented in which concave lenses constituting the light ray diverging units 204 in the random color filter array 202 are arranged between the image forming optical system 201 and the color filters 202a to 202c, and concave lenses constituting the light ray diverging units 204 are additionally arranged also between the color filters 202a to 202c and the photodiodes 203a.

A configuration may be implemented in which concave lenses constituting the light ray diverging units 204 in the random color filter array 202 are not arranged between the image forming optical system 201 and the color filters 202a to 202c, and concave lenses constituting the light ray diverging units 204 are arranged between the color filters 202a to 202c and the photodiodes 203a.

Figure 9:
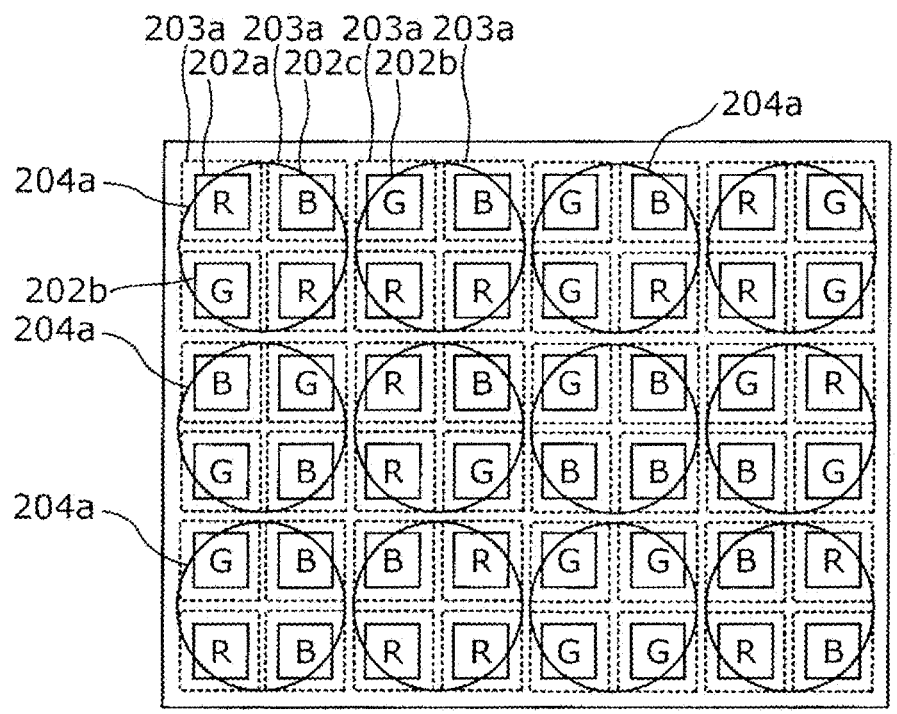
FIG. 9 is a schematic drawing depicting an arrangement on a two-dimensional plane of a random color filter array, which is configured of concave lenses and three types of filters according to modified example 1, and an imaging sensor.

Furthermore, in the examples of FIGS. 6 and 7, the sizes of the concave lenses of each of the light ray diverging units 204 were substantially equivalent to the color filters 202a to 202c and the photodiodes 203a; however, the sizes of the concave lenses of the light ray diverging units 204 are not restricted thereto, and may be larger or may be smaller than the color filters 202a to 202c and the photodiodes 203a. FIG. 9 depicts modified example 1 of the random color filter array 202, in which the sizes of the concave lenses of the light ray diverging units 204 depicted in FIG. 6 have been increased. In modified example 1 of FIG. 9, the light ray diverging units 204 have been modified to be light ray diverging units 204a in the random color filter array 202. Furthermore, FIG. 9 depicts an example in which the outer periphery of the concave lenses constituting the light ray diverging units 204a is a circular shape. In this example, the sizes of the concave lenses of each of the light ray diverging units 204 are larger than the color filters 202a to 202c and the photodiodes 203a. As depicted in FIG. 9, as a result of making each of the concave lenses to be larger than the photodiodes 203a and the like, there is an increase in the variation in the point-spread function in the imaging sensor 203 according to position, and it is therefore possible to realize the random color filter array 202 having further increased randomness. When the randomness of the random color filter array 202 is increased, the image quality of a color image generated by the color image generation circuit 105 by means of compressed sensing improves.

In the description heretofore, examples have been given in which the sizes of the lenses constituting the plurality of light ray diverging units 204 or the plurality of light ray diverging units 204a provided in the random color filter array 202 are uniform. However, one or more of the size, refractive index, and curvature may be mutually different in each of the plurality of concave lenses provided in the random color filter array 202. The curvature is the curvature for the curved surface of a concave lens. For example, in a case where the recessed section has a circular arc shape in a cross section passing through the optical axis of a concave lens, for example, the curvature of the concave lens is the inverse of the radius of a circle having that circular arc. It should be noted that the refractive indexes of the concave lenses can be made to be mutually different by mutually varying the materials of each of the plurality of concave lenses, for example. The point-spread function of each position of the random color filter array 202 can be realized as being random by, for example, making one or more of the size, refractive index, and curvature to be mutually different in each of the plurality of concave lenses provided in the random color filter array 202.

Figure 10:
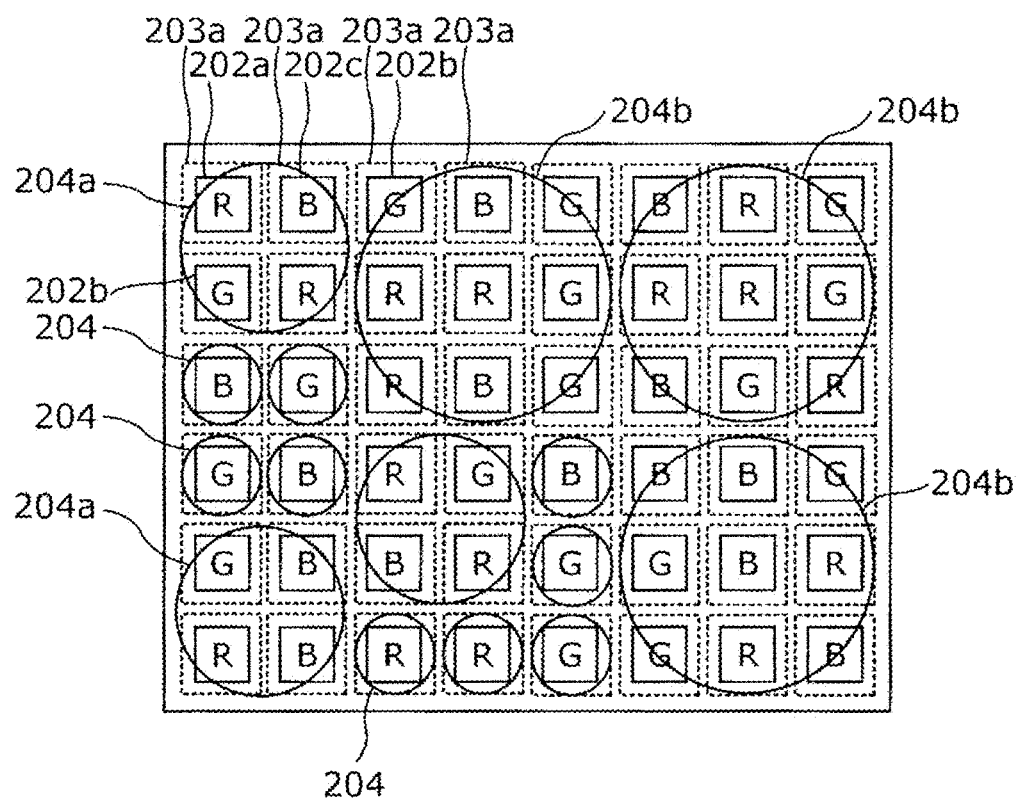
FIG. 10 is a schematic drawing depicting an arrangement on a two-dimensional plane of a random color filter array, which is configured of concave lenses and three types of filters according to modified example 2, and an imaging sensor.

FIG. 10 depicts modified example 2 of the random color filter array 202, in which the sizes of the concave lenses depicted in FIG. 6 are made to be different in each position of those concave lenses. In modified example 2 of FIG. 10, the random color filter array 202 is implemented in such a way as to include concave lenses of the light ray diverging units 204 depicted in FIG. 6, concave lenses of the light ray diverging units 204a depicted in FIG. 9, which have a larger size, and concave lenses of light ray diverging units 204b, which have an even larger size. In this example, the sizes of the concave lenses of each of the light ray diverging units 204, 204a, and 204b are mutually different. As a result, the variation in the point-spread function of each position of the random color filter array 202 increases and becomes diverse, and the randomness of the random color filter array 202 can be improved. The variation in the point-spread function of each position of the random color filter array 202 can be increased and the randomness of the random color filter array 202 can be improved even in a case where the refractive indexes of each of the plurality of concave lenses are mutually different, in a case where the curvatures are mutually different, or in a case where a plurality from among the size, refractive index, and curvature are mutually different, besides the sizes of each of the plurality of concave lenses provided in the random color filter array 202 being mutually different. When the randomness of the random color filter array 202 is increased, the image quality of a color image generated by the color image generation circuit 105 by means of compressed sensing improves.

In this way, the light ray diverging units 204 may be replaced with the light ray diverging units 204a, or may be combined with the light ray diverging units 204a and the light ray diverging units 204b. It is possible for the size, refractive index, or curvature of the concave lenses constituting the light ray diverging units 204 to be arbitrarily changed for each concave lens.

As mentioned above, in the imaging system 10 according to the present embodiment, the random color filter array 202 has the light ray diverging units 204 or the light ray diverging units 204a and 204b that cause incident light to be diverged, and therefore has a light transmittance and point-spread function that differ according to the position and the wavelength of light, and a random (that is, enables random sampling) optical filter array is realized. If one or more of the size, refractive index, and curvature are made to be mutually different for each of the plurality of concave lenses that cause incident light to be diverged in the random color filter array 202, the point-spread function, for example, can be made to be random, and it is possible for the randomness of the random color filter array 202 to be improved. Other than the aforementioned, for example, if any one of the three types of color filters 202a to 202c is randomly selected and arranged in each position making up the two-dimensional array on the two-dimensional plane in the random color filter array 202, as depicted in FIG. 6, the randomness can be improved compared to when not randomly arranged.

In the above description, the filters making up the random color filter array 202 were the three types of color filters 202a to 202c; however, there may be four or more types of filters, and the filters do not necessarily have to be color filters as long as they function as optical filters that have mutually different light transmittances as wavelength characteristics. Hereinafter, a mode in which four types of filters are used will be described as the aforementioned random color filter array 202.

Figure 11:
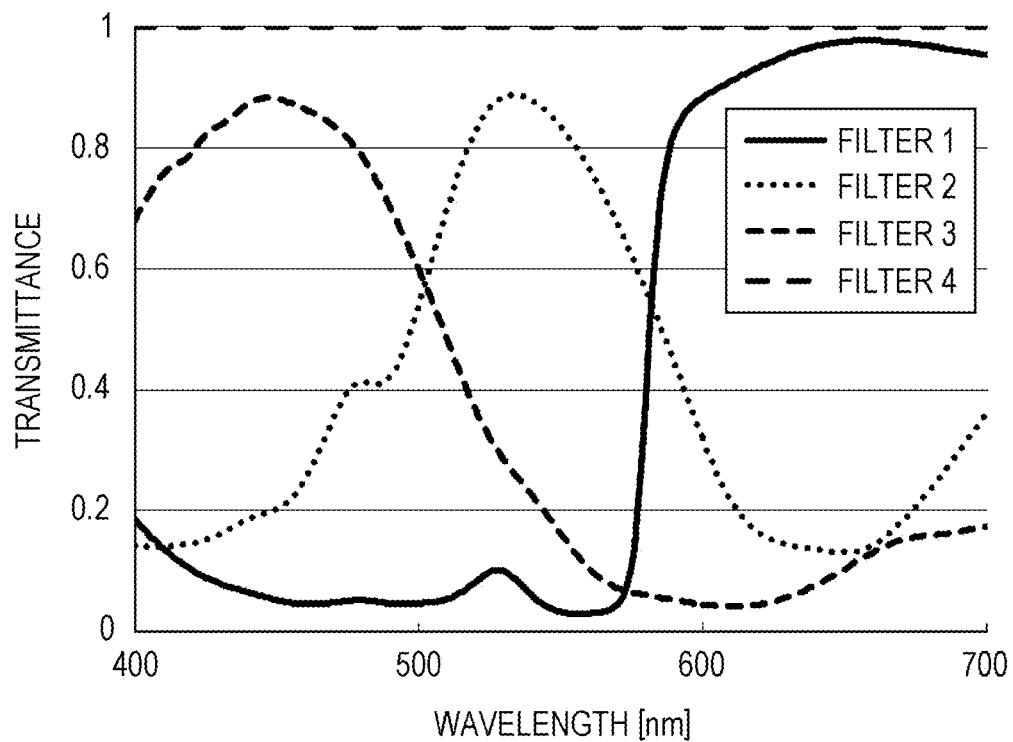
FIG. 11 is a drawing depicting transmittance as a wavelength characteristic of four types of filters according to an embodiment.
Figure 12:
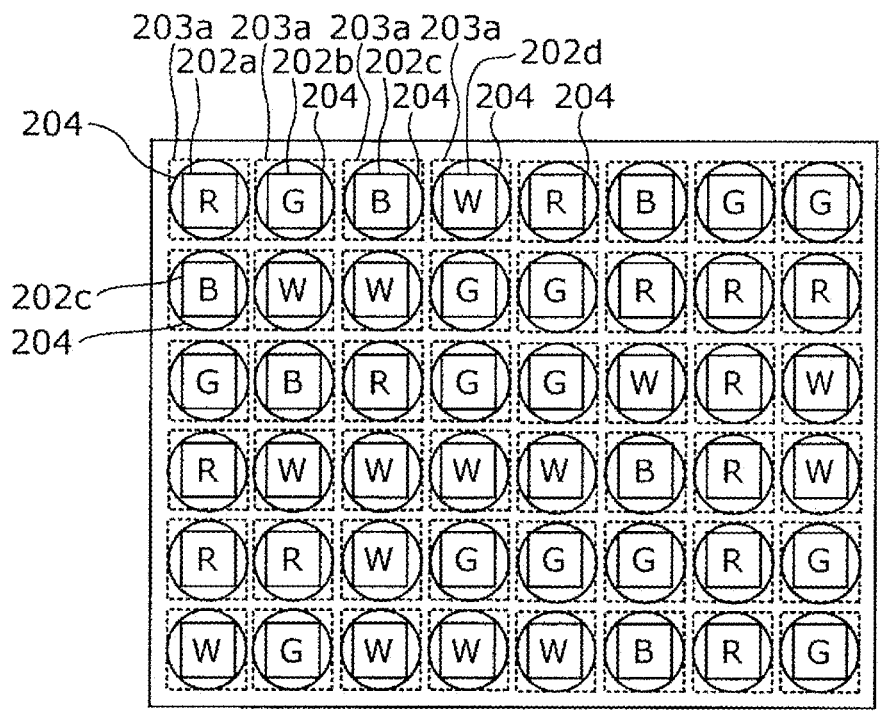
FIG. 12 is a schematic drawing depicting an arrangement on a two-dimensional plane of a random color filter array, which is configured of concave lenses and the four types of filters, and the imaging sensor.

FIG. 11 depicts light transmittance as wavelength characteristics of the four types of filters. Furthermore, FIG. 12 depicts the arrangement on a two-dimensional plane of the concave lenses and filters of the random color filter array 202 configured of the four types of filters, and the photodiodes 203a of the imaging sensor 203. In FIG. 11, filters 1 to 3 are the color filters 202a to 202c, and filter 4 is a filter that passes all wavelengths. In FIG. 12, a color filter 202d serving as this filter 4 is represented by W. Here, this filter that passes all wavelengths in the random color filter array 202 is called a color filter for convenience. This filter 4 (namely, the color filter 202d) can be realized by not adding a member serving as a filter when the random color filter array is produced. By providing a portion in which a member is not added in this way, a filter that passes all wavelengths is included in the random color filter array 202, and cost can thereby be suppressed. Furthermore, by increasing the types of the filters, the randomness of the random color filter array 202 can be improved. When the randomness of the random color filter array 202 is increased, the image quality of a color image generated by the color image generation circuit 105 by means of compressed sensing improves.

In the aforementioned embodiment, the three types of color filters 202a to 202c making up the random color filter array 202 are an R (red) filter, a G (green) filter, and a B (blue) filter, respectively; however, the filter characteristics are not restricted thereto. For example, complementary color filters (for example, magenta, cyan, and yellow filters) having a wide transmission band compared to primary color filters such as an R filter, a G filter, or a B filter may be used in the random color filter array 202.

Figure 13:
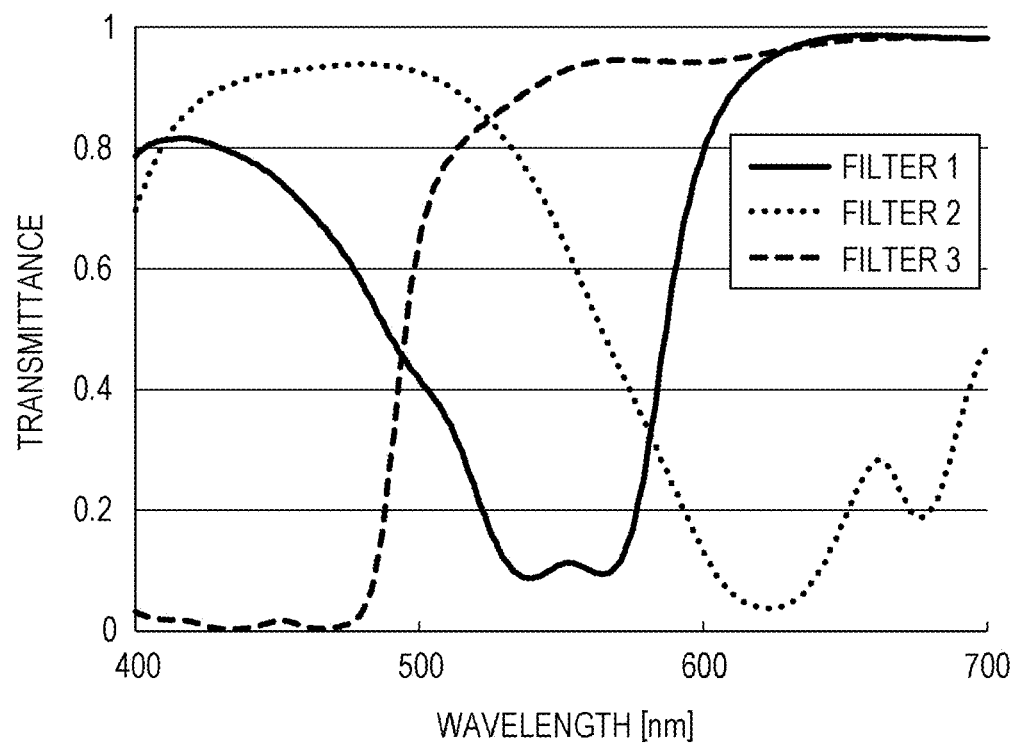
FIG. 13 is a drawing depicting transmittance as a wavelength characteristic of three types of complementary color filters.

FIG. 13 is a drawing depicting light transmittance as wavelength characteristics of three types of complementary color filters. In the same drawing, filter 1 is a magenta filter, for example, filter 2 is a cyan filter, for example, and filter 3 is a yellow filter, for example.

The transmission band widens due to using these types of complementary color filters, and an image having reduced noise can therefore be acquired.

It goes without saying that R, G, and B color filters, namely primary color filters, a filter that passes all wavelengths, and complementary color filters may be combined as the filters making up the random color filter array 202. For example, the random color filter array 202 may be configured with the filters depicted in FIGS. 11 and 13 being combined. In this case, the random color filter array 202 has a combination of seven types of filters and the light ray diverging units 204, and the randomness can therefore be improved.

Similarly, the filters depicted in FIGS. 5 and 13 may be combined, and the random color filter array 202 having a combination of six types of filters and the light ray diverging units 204 may be configured. For example, the random color filter array 202 may be configured in such a way that light having passed through six of the six types of filters is received by one of the photodiodes 203a. In this case, the random color filter array 202 has a combination of six types of filters and the light ray diverging units 204, and the randomness can therefore be improved.

(Processing of Image Generation Device 12)

Next, processing in the image generation device 12 (see FIG. 1) will be described based on FIG. 14.

Figure 14:
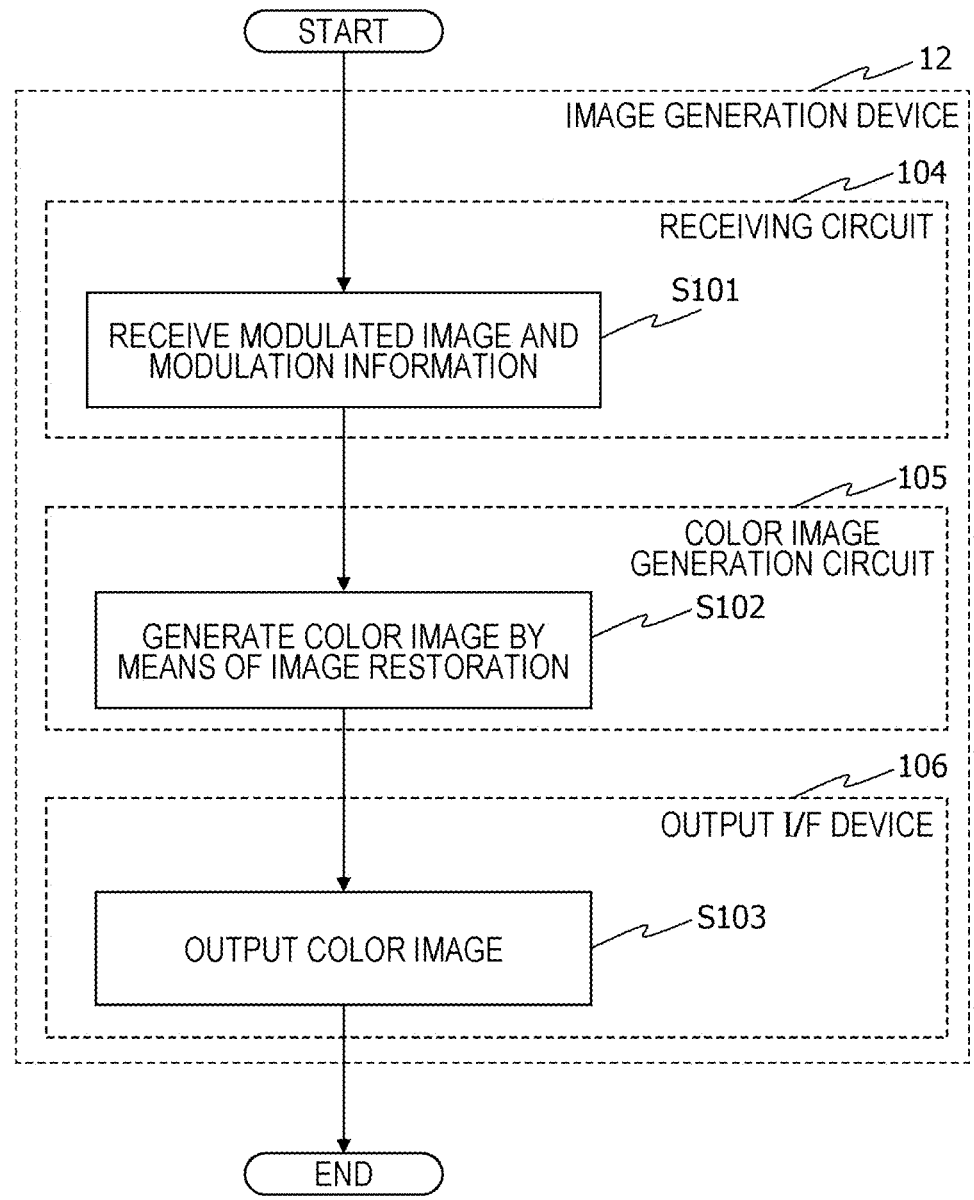
FIG. 14 is a flowchart depicting the main processing procedures of an image generation device in the imaging system according to embodiment 1.

FIG. 14 is a flowchart depicting the main processing procedures of the image generation device 12.

The receiving circuit 104 of the image generation device 12 receives a modulated image and modulation information transmitted by the transmission circuit 103 of the imaging device 11 (step S101).

Next, the color image generation circuit 105 generates a color image using an image restoration technique (for example, a compressed sensing technique), from the modulated image and the modulation information (step S102).

Next, the output interface device 106 outputs the color image generated by the color image generation circuit 105, to be displayed on a display or used in image processing for detecting humans or the like (step S103).

(Color Image Generation Processing)

Hereinafter, the color image generation processing carried out by the color image generation circuit 105 in step S102 will be described in more detail.

The color image generation processing can be formulated as described below in a case where a captured modulated image is taken as y and a generated image that is a generated color RGB image is taken as x.

$$y = Ax. \quad \text{(equation 1)}$$

Here, matrix A is a sampling matrix that indicates the modulation information. The sampling matrix A indicates a relationship between the modulated image y and the generated image x. For example, in a case where the number of pixels is N, the modulated image y is expressed by a matrix of N rows and one column, the generated image x is expressed by a matrix of 3N rows and one column, and the sampling matrix A is expressed by a matrix of N rows and 3N columns.

Hereinafter, a method for acquiring the sampling matrix A will be described.

The sampling matrix A indicates a light transmittance and point-spread function that differ according to each position and wavelength band. Thus, for example, the sampling matrix A can be acquired by arranging a monitor in such a way as to cover the entire field of view captured by the imaging sensor 203 as an object, and performing imaging while displaying red, green, and blue dot images in sequence on the monitor. That is, in a case where correct RGB values present a known L-type of image $x_i$ (i=1, . . . , L), and a modulated image captured at such time is taken as $y_i$, the following relational expression is established.

$$[y_1 y_2 \ldots y_L] = A[x_1 x_2 \ldots x_L] \quad \text{(equation 1')}$$

Here, the sampling matrix A is a matrix of N rows and 3N columns, and therefore the sampling matrix A can be obtained from equation 1' provided that L is equal to or greater than 3N. It goes without saying this kind of processing may be carried out with an image being actually displayed on a monitor and an actual object being arranged, or may be calculated by means of a computer simulation using information such as the wavelength characteristics of the color filters and the sizes, refractive indexes, and curvatures of the light ray diverging units.

Next, a method for acquiring the generated image x from the sampling matrix A and the modulated image y in the color image generation circuit 105 will be described. In order to simplify the description, a case where the number of pixels of the imaging sensor 203 is N=16 will be described.

FIGS. 15A to 15D are schematic drawings depicting the modulated image y for a case where the number of pixels of the imaging sensor 203 is N=16, and an R image r, a G image g, and a B image b for the generated image x (color RGB image) which is generated based on this modulated image y. FIG. 15A depicts the modulated image y, FIG. 15B depicts the R image r constituting the red (R) channel of the color RGB image generated based on the modulated image y, FIG. 15C depicts the G image g constituting the green (G) channel of the color image generated based on the modulated image y, and FIG. 15D depicts the B image b constituting the blue (B) channel of the color image generated based on the modulated image y. The modulated image y and the generated image x are represented by the following equations.

$$y=[y_1 y_2 y_3 \ldots y_{16}]^T.$$

$$x=[r_1 g_1 b_1 r_2 g_2 b_2 r_3 g_3 b_3 \ldots r_{16} g_{16} b_{16}]^T. \quad \text{(equation 2)}$$

As is clear from equation 2, in equation 1, there are 48 elements for x which is an unknown variable, and there are 16 elements for y which is an observed variable. That is, there are few equations for unknown variables. Therefore, equation 1 constitutes an ill-posed problem.

The imaging system 10 uses a compressed sensing technique in order to solve this ill-posed problem. The compressed sensing technique is a technique in which an amount of data is compressed by carrying out addition processing (encoding) when sensing a signal, and the original signal is decoded (restored) by carrying out restoration processing using the compressed data. In compressed sensing processing, prior knowledge is used in order to solve ill-posed problems.

Total variation which is an absolute value sum for luminance changes among nearby positions in an image may be used as prior knowledge for natural images (for example, Rudin L. I., Osher S. J., and Fatemi E., "Nonlinear Total Variation Based Noise Removal Algorithms", Physica D, vol. 60, pp. 259-268, 1992, and Shunsuke Ono, Isao Yamada, "Decorrelated Vectorial Total Variation", IEEE Conference on Computer Vision and Pattern Recognition, 2014). Furthermore, sparsity in which many coefficients become zero in linear transforms such as wavelet transforms, DCT transforms, and curvelet transforms may be used (for example, J. Ma, "Improved Iterative Curvelet Thresholding for Compressed Sensing and Measurement", IEEE Transactions on Instrumentation & Measurement, vol. 60, no. 1, pp. 126-136, 2011). Furthermore, dictionary learning, in which transform coefficients for the aforementioned linear transforms are acquired by learning, or the like may be used (for example, M. Aharon, M. Elad, and A. M. Bruckstein, "K-SVD: An Algorithm for Designing Overcomplete Dictionaries for Sparse Representation", IEEE Transactions on Image Processing, vol. 54, no. 11, pp. 4311-4322, 2006).

Here, decorrelated vectorial total variation, which is a method classified as a form of total variation, will be described. This method suppresses the generation of artifacts referred to as false color by calculating gradients for a luminance component and a chrominance component of a color image in a separated manner. This is realized by minimizing the following evaluation function.

$$\arg \min_{x \in [0,255]^{3 \times N}} J(x) + \|Ax - y\|_2^2 \quad \text{(equation 3)}$$

This evaluation function is made up of the following three terms.

1. Data fidelity term: $\|Ax-y\|^2_2$: constraint term for satisfying equation 1
2. Dynamic range term: min $([0, 255]^{3 \times N})$ (range of x for calculating minimum value): constraint term for the pixel value to be 0 or more and 255 or less
3. Decorrelated vectorial total variation term: J(x): total variation term with which gradients for the luminance component and the chrominance component of a color image are separated Here, $\|Ax-y\|^2_2$ indicates the square sum of Ax-y (the square of the L2 norm). Furthermore, J(x) corresponds to a difference among nearby pixels relating to the luminance component and the chrominance component in an entire image, and is expressed by the following equations 4 to 8. It should be noted that, in the following equations 4 to 8, R indicates a real number and R+ indicates a non-negative real number.

$$J: R^{3N} \to R_+ : x \mapsto \|DCx\|_{1,2}^{(w,2,4)} \quad \text{(equation 4)}$$

$$x = [x_R^T \ x_G^T \ x_B^T]^T \in R^{3N} \quad \text{(equation 5)}$$

$$C: R^{3N} \to R^{3N} : x \mapsto [x_1 \ x_2 \ x_3] \quad \text{(equation 6)}$$

(orthogonal color transform)

$$x_1 = \frac{1}{\sqrt{3}}(x_R + x_G + x_B),$$

$$x_2 = \frac{1}{\sqrt{2}}(x_R - x_B),$$

$$x_3 = \frac{1}{\sqrt{6}}(x_R - 2x_G + x_B)$$

$$D = diag(D_1 \ D_1 \ D_1) \in R^{6N \times 3N} \quad \text{(equation 7)}$$

(primary gradient operator in color image)

$$D_1 = [D_v^T \ D_h^T]^T \in R^{2N \times N}$$

(primary gradient boundary condition operator of each channel)

$$D_v, D_h \in R^{N \times N}$$

(vertical/horizontal primary gradient operator)
(Neumann boundary)

$$\|\cdot\|_{1,2}^{(w,k_1,k_2)}: R^{(k_1+k_2)N} \to \quad \text{(equation 8)}$$

$$R_+: x \mapsto w\|x_1\|_{1,2}^{(k_1)} + \|x_2\|_{1,2}^{(k_2)}$$

$$x = [x_1^T \ x_2^T]^T, x_1 \in R^{k_1 N}, x_2 \in R^{k_2 N}$$

$$w \in (0, 1)$$

$$\|\cdot\|_{1,2}^{(k)}: R^{kN} \to R_+ : x \mapsto \sum_{i=1}^{N} \sqrt{\sum_{j=0}^{k-1} m_{i+jN}^2}$$

($m_i$ is the $i^{th}$ element of $x$)

Figure 16C:
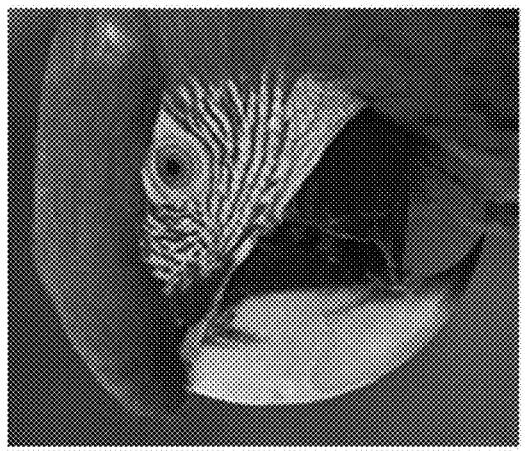
FIGS. 16A to 16C depict an example of a color image generated by a color image generation circuit or the like in embodiment 1.
Figure 16B:
Figure 16A:

FIGS. 16A to 16C depict an example of a color image generated by the color image generation circuit 105 in the present embodiment. FIG. 16A depicts a correct image (correct color image) captured by a three-sensor camera. FIG. 16B depicts a demosaicing image produced by the ACPI (adaptive color plane interpolation) method described in the specification of U.S. Pat. No. 5,629,734, which is a general demosaicing method. FIG. 16C depicts a generated image (restored image) that has been generated using decorrelated vectorial total variation by the color image generation circuit 105 in the present embodiment. The inventors of the present application actually generated and compared color images; however, in FIGS. 16A to 16C, each image depicts the luminance values (that is, luminance values calculated by multiplying by a coefficient for each color and adding component values for R, G, and B) of that image. Furthermore, FIGS. 16B and 16C also indicate a PSNR (peak signal-to-noise ratio) for each of the images.

As depicted in FIGS. 16A to 16C, a generated image (restored image) of the present embodiment has a PSNR that is an improvement of 1 dB or more compared to the ACPI method, and can be said to be the closest to the correct image.

Furthermore, with compressed sensing, it is known that the image quality of the restored image improves as the randomness of the sampling matrix A increases. The random color filter array 202 of the present embodiment increases the randomness of the sampling matrix A due to having the light ray diverging units 204, and the image quality of the restored image can thereby be improved.

According to the imaging system 10 which carries out imaging using the aforementioned random color filter array 202, a high-definition color image having reduced artifacts can be acquired by carrying out color image generation processing by means of the compressed sensing technique.

Embodiment 2

Figure 17:
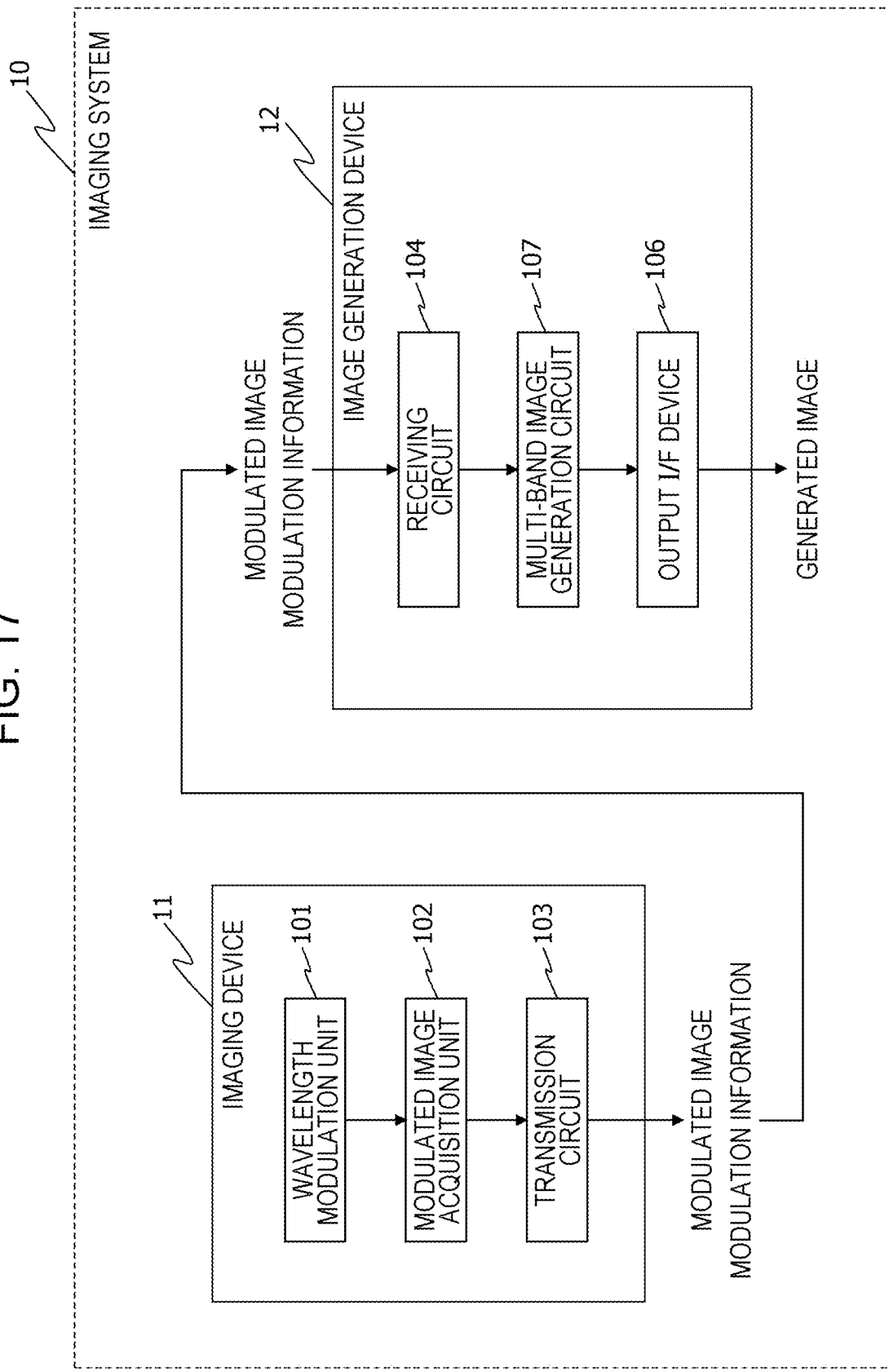
FIG. 17 is a schematic drawing depicting a configuration of an imaging system according to embodiment 2.

FIG. 17 depicts a configuration of the imaging system 10 according to the present embodiment. From among the constituent elements of the imaging system 10 according to the present embodiment, constituent elements that are the same as those of the imaging system 10 given in embodiment 1 are denoted in FIG. 17 by the same reference numbers as in FIG. 1, and descriptions thereof are omitted here as appropriate. The imaging system 10 according to the present embodiment is provided with a multi-band image generation circuit 107, instead of the color image generation circuit 105 given in embodiment 1, in the image generation device 12. This imaging system 10 can generate a multi-band image that is not restricted to an RGB color image of the three primary colors. A multi-band image is an image expressed by a signal in which the wavelength bands of light are divided into four or more regions. Those wavelength bands are not restricted to visible light and may be wavelength bands such as near-infrared, infrared, and ultraviolet, and a multi-band image can be, for example, a near-infrared light image, an infrared light image, an ultraviolet light image, or the like.

The multi-band image generation circuit 107 generates a multi-band image using an image restoration technique (for example, the compressed sensing technique), from a modulated image and modulation information. The multi-band image generation circuit 107 sends the generated multi-band image to the output interface device 106.

The output interface device 106 according to the present embodiment outputs the multi-band image to outside of the image generation device 12 as a digital signal or as an analog signal. The output interface device 106 may switch the output image in such a way as to output a visible light color image in a bright scene and to output a near-infrared light image in a dark scene.

Furthermore, the random color filter array 202 in the wavelength modulation unit 101 (see FIG. 17) of the imaging system 10 according to the present embodiment may be a random optical filter array that includes the light ray diverging units 204, configured as an arrangement of a plurality of types of optical filters including, for example, a filter that primarily passes near-infrared light or the like as well as color filters such as an R filter, a G filter, and a B filter. For example, in a case where a near-infrared light image is to be acquired as a multi-band image, a filter that passes near-infrared light can be included in the random optical filter array.

Hereinafter, processing in the image generation device 12 (see FIG. 17) according to the present embodiment will be described based on FIG. 18.

Figure 18:
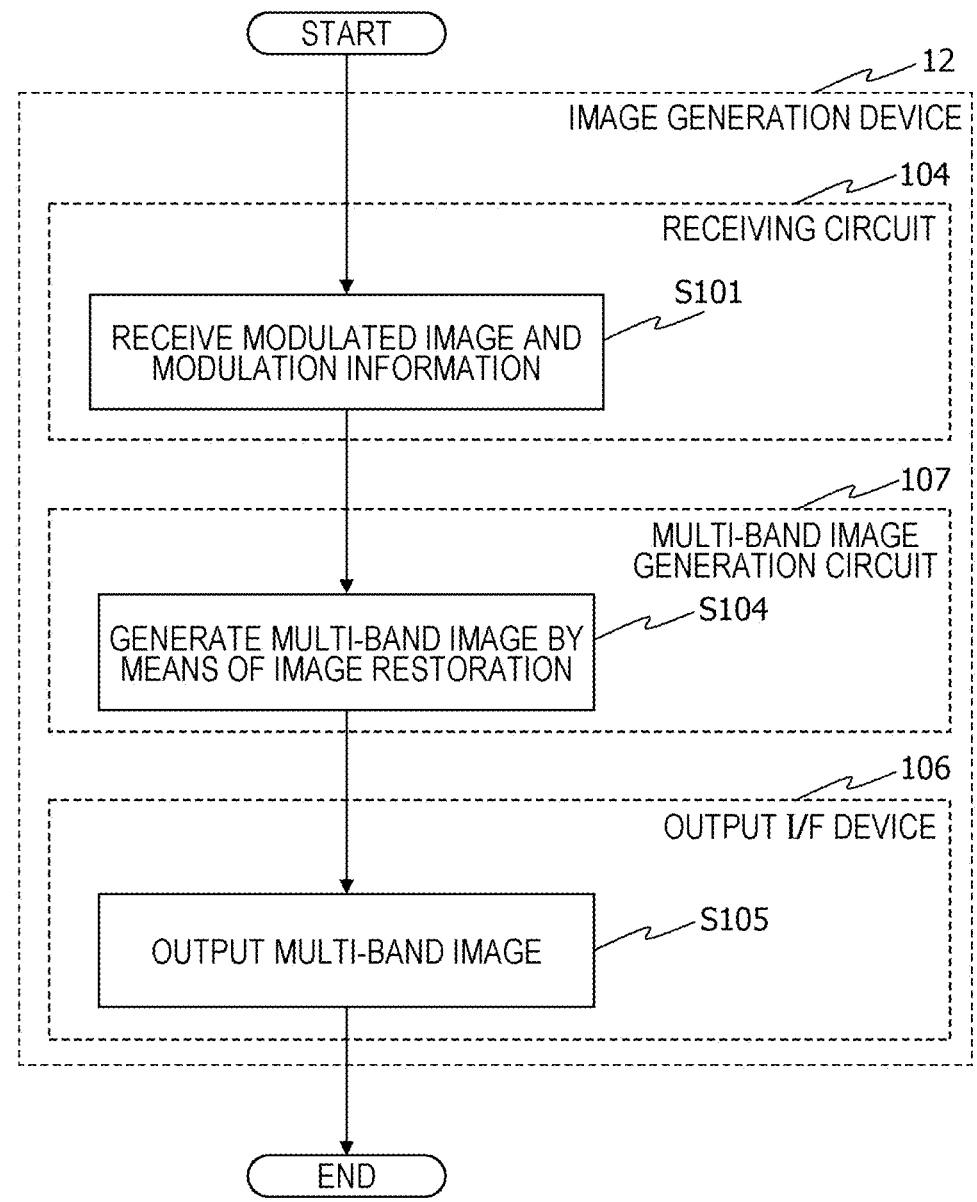
FIG. 18 is a flowchart depicting the main processing procedures of an image generation device in the imaging system according to embodiment 2.

FIG. 18 is a flowchart depicting the main processing procedures of the image generation device 12 in the present embodiment. In the same drawing, elements that are the same as in FIG. 14 are denoted by the same reference numbers.

The receiving circuit 104 of the image generation device 12 receives a modulated image and modulation information transmitted by the transmission circuit 103 (step S101).

Next, the multi-band image generation circuit 107 carries out multi-band image generation processing that generates a multi-band image using an image restoration technique (for example, the compressed sensing technique), from the modulated image and modulation information (step S104).

Next, the output interface device 106 outputs the multi-band image generated by the multi-band image generation circuit 107, to be displayed on a display or used in image processing for detecting humans or the like (step S105).

(Multi-Band Image Generation Processing)

Hereinafter, the multi-band image generation processing carried out in step S104 will be described in more detail.

The multi-band image generation processing can be formulated as described below, in a case where a captured modulated image is taken as y' and a generated M-band multi-band image is taken as x' (M being an integer of 4 or more).

$$y' = Ax'. \quad \text{(equation 9)}$$

Here, matrix A is a sampling matrix that indicates the modulation information.

In order to simplify the description, if it is assumed that the number of pixels of the imaging sensor 203 is N=16 (see FIGS. 15A to 15D), the modulated image y' and the generated image x', which is a multi-band image generated based on the modulated image y', are represented by the following equations. The generated image x' is as depicted in FIG. 19 if represented divided into images for each of the M channels.

$$y' = [y_1 y_2 y_3 \ldots y_{16}]^T.$$

$$x' = [x_{1,1} x_{2,1} x_{3,1} \ldots x_{M,1} x_{1,2} x_{2,2} x_{3,2} \ldots x_{M,2} \ldots x_{1,16} x_{2,16} x_{3,16} \ldots x_{M,16}]^T. \quad \text{(equation 10)}$$

As is clear from equation 10, in equation 9, there are 16M elements for x' which is an unknown variable, and there are 16 elements for y' which is an observed variable. That is, there are few equations for unknown variables. Therefore, equation 9 constitutes an ill-posed problem. However, as indicated in embodiment 1, this ill-posed problem can be solved by using the compressed sensing technique. The various types of techniques given in embodiment 1 can be applied also for the imaging system 10 that generates a multi-band image by means of imaging of the present embodiment.

As mentioned above, the imaging system 10 of the present embodiment carries out imaging using the random color filter array 202 or a random optical filter array, and carries out multi-band image generation processing by means of the compressed sensing technique, and can thereby reduce artifacts and acquire a high-definition multi-band image.

Other Embodiments

As mentioned above, embodiments 1 and 2 have been described as exemplifications of the technique according to the present disclosure. However, the technique according to the present disclosure is not restricted to these embodiments, and can also be applied to an embodiment in which an alteration, substitution, addition, omission, or the like has been carried out as appropriate. In other words, modes in which various types of modifications conceived by a person skilled in the art have been implemented in the aforementioned embodiments, modes constructed by combining the constituent elements in mutually different embodiments, and the like are also included within an embodiment of the technique according to the present disclosure provided they do not depart from the purpose of the present disclosure. For example, modified examples such as the following are also included within an embodiment of the technique according to the present disclosure.

In the aforementioned embodiments, an example was given in which the imaging system 10 is provided with the imaging device 11 and the image generation device 12; however, the image generation device according to the present disclosure may contain the aforementioned imaging device 11, that is, may be configured of the aforementioned imaging system 10.

In the aforementioned embodiments, the imaging system 10 that generates a color image or a multi-band image was described; however, the imaging system 10 may generate an image expressed by a signal in which an arbitrary wavelength band of light is divided into two or more regions, and, for example, the imaging system 10 may generate an image expressed by a signal in which the infrared light region is divided into three regions.

Furthermore, the aforementioned image forming optical system 201 is not restricted to using a lens for image forming, and, for example, may use a reflective mirror or the like.

Figures 20, 21:
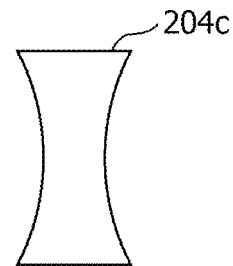
FIG. 20 is a cross-sectional drawing depicting another example of a shape of a concave lens.
FIG. 21 is a schematic drawing depicting a Bayer array.

Furthermore, in the aforementioned embodiments, FIGS. 4, 7, and the like depicted examples in which the light ray diverging units 204 are constituted by concave lenses that pass and guide incident light to the photodiodes 203a. The concave lenses are lenses that cause light of incident parallel light beams to diverge without converging. The concave lenses have a shape in which the light-receiving surface that receives incident light or the surface opposite to that light-receiving surface is recessed toward the center of the lens, for example. In the examples of FIGS. 4 and 7, the concave lenses constituting the light ray diverging units 204 are plano-concave lenses in which the shape of the surfaces where incident light traveling toward the photodiodes 203a is incident on the concave lenses is a concave surface, and shape of the surfaces where light that has passed through the concave lenses is emitted is a planar surface. Opposite to this example, the concave lenses constituting the light ray diverging units 204 may be plano-concave lenses in which the shape of the surfaces where incident light traveling toward the photodiodes 203a is incident on the concave lenses is a planar surface, and shape of the surfaces where light that has passed through the concave lenses is emitted is a concave surface. Furthermore, in the random color filter array 202 or the random optical filter array, as depicted in FIG. 20, the light ray diverging units 204 may be replaced with light ray diverging units 204c which are constituted by biconcave lenses that have concave surfaces at both the front and rear of the lenses. Furthermore, in the aforementioned embodiments, the shape of the concave surfaces of the concave lenses was a shape that is similar to a spherical surface, for example; however, there is not restriction to a spherical surface, and an aspheric surface may be used. Furthermore, the outer periphery of the concave lenses is not restricted to a circle, and may be an ellipse, for example. Furthermore, the shape of the concave surfaces of the concave lenses may be a shape that is similar to a side surface of a cylinder, for example. In this case the concave lenses have a shape that has a circular arc-shaped recessed section in a cross section passing through the optical axis of the lens, seen from a specific direction perpendicular to the optical axis of the lens, but does not have a recessed section in a cross section passing through the optical axis of the lens, seen from another direction perpendicular to both the optical axis of the lens and the aforementioned specific direction. Furthermore, the concave lenses may have a structure in which a plurality of layers configured of mutually different materials are superimposed, or may be formed of a single material.

Furthermore, the constituent elements (particularly the circuits and the like) of the imaging system 10 described in the aforementioned embodiments may be configured of dedicated hardware, or may be realized by executing software (a program) suitable for the constituent elements. The constituent elements may be realized by a program execution unit such as a microprocessor reading out and executing a program recorded in a storage medium (or a recording medium) such as a hard disk or a semiconductor memory.

Furthermore, the plurality of circuits included in the imaging device 11 may constitute one circuit in their entirety or may each constitute separate circuits. Similarly, the plurality of circuits included in the image generation device 12 may constitute one circuit in their entirety or may each constitute separate circuits. Furthermore, these circuits may each be a general-purpose circuit or may be a dedicated circuit. Furthermore, for example, processing executed by a specific constituent element in the aforementioned embodiments may be executed by another constituent element instead of the specific constituent element. Furthermore, the order in which the various types of processing in the aforementioned embodiments is executed may be altered, and a plurality of processing may be executed in parallel.

An image generation device according to the present disclosure as described above is provided with: a random optical filter array (for example, the random color filter array 202) that has a plurality of types of optical filters (for example, the color filters 202a to 202d, the complementary color filters, the filter that primarily passes light other than visible light, or the like) and a plurality of concave lenses (for example, the concave lenses constituting the light ray diverging units 204 and 204a to 204c or the like); the photodiodes 203a that receive light that has passed through the random optical filter array; the AD conversion unit 203b that converts the light received by the photodiodes 203a into digital data; and a generation circuit (for example, the color image generation circuit 105, the multi-band image generation circuit 107, or the like) that generates an image using that digital data and modulation information of the random optical filter array, in which the plurality of concave lenses are located between the plurality of types of optical filters and the photodiodes 203a, or in front of the plurality of types of optical filters (for example, on an optical path along which light that has passed through the image forming optical system 201 reaches the optical filters). Thus, the photodiodes 203a, which serve as pixels, receive light that has passed through several of the plurality of types of optical filters having mutually different wavelength characteristics pertaining to the relationship between wavelength and transmittance, and the photodiodes 203a are able to acquire sufficient information due to the diverging of light by the plurality of concave lenses; therefore, a decline in resolution can be suppressed and an appropriate image can be generated.

Furthermore, for example, one or more of a size, a refractive index, and a curvature may be mutually different in each of the aforementioned plurality of concave lenses.

Furthermore, for example, the image generation device may be provided with a convex lens (for example, a convex lens constituting the image forming optical system 201) in front of the aforementioned plurality of concave lenses, and the plurality of concave lenses may cause light that has passed through the convex lens to diverge in such a way as to pass through the plurality of optical filters.

Furthermore, for example, the optical filters may be the color filters 202a to 202c, the random optical filter array may be the random color filter array 202, the random color filter array 202 may have the plurality of types of color filters 202a to 202c randomly arranged therein, and the generation circuit may be the color image generation circuit 105.

Furthermore, for example, the generation circuit may be the multi-band image generation circuit 107.

Furthermore, for example, the generation circuit (for example, the color image generation circuit 105, the multi-band image generation circuit 107, or the like) may generate the image using a compressed sensing technique.

Furthermore, an imaging device according to the present disclosure is provided with: a random optical filter array (for example, the random color filter array 202) that has a plurality of types of optical filters (for example, the color filters 202a to 202d or the like) and a plurality of concave lenses (for example, the concave lenses constituting the light ray diverging units 204 and 204a to 204c or the like); the photodiodes 203a that receive light that has passed through the random optical filter array; and the AD conversion unit 203b that converts the light received by the photodiodes 203a into digital data, in which the plurality of concave lenses are located between the plurality of optical filters and the photodiodes 203a, or in front of the plurality of types of optical filters. Thus, due to the diverging of light by the plurality of concave lenses, light can be received having passed through several of the plurality of types of optical filters that have mutually different wavelength characteristics pertaining to the relationship between wavelength and transmittance, and therefore the photodiodes 203a, which serve as pixels, are able to acquire sufficient information.

The imaging system according to the present disclosure can be applied to various types of cameras.

What is claimed is:

1. An imaging system, comprising:
a random optical filter array that has a plurality of concave lenses and a plurality of optical filters having different transmission characteristics;
a photodiode that receives light that has passed through the random optical filter array;
an AD converter that converts the light received by the photodiode into digital data; and
a generation circuit that generates image data using the digital data and modulation information of the random optical filter array,
wherein the plurality of concave lenses are located between the plurality of types of optical filters and the photodiode, or the plurality of optical filters are located between the plurality of concave lenses and the photodiode,
wherein the modulation information is a sampling matrix, wherein $[y_1\ y_2\ \ldots\ y_n]^T = A\ [x_{1,1}\ x_{1,2}\ \ldots\ x_{1,m}\ \ldots\ x_{n,1}\ x_{n,2}\ \ldots\ x_{n,m}]^T$,
wherein the digital data is the $[y_1\ y_2\ \ldots\ y_n]^T$, the image data is the $[x_{1,1}\ x_{1,2}\ \ldots\ x_{1,m}\ \ldots\ x_{n,1}\ x_{n,2}\ \ldots\ x_{n,m}]^T$, the sampling matrix is the A, and
wherein the sampling matrix is different from a second sampling matrix for a second random optical filter array having the plurality of optical filters and not having the plurality of concave lenses.

2. The imaging system according to claim 1,
wherein one or more of a size, a refractive index, and a curvature that defines a concave surface of a lens are mutually different in each of the plurality of concave lenses.

3. The imaging system according to claim 1,
wherein the imaging system is provided with a convex lens,
the plurality of concave lenses are located between the convex lens and the plurality of optical filters in a case where the plurality of optical filters are located between the plurality of concave lenses and the photodiode, and
the plurality of concave lenses cause light that has passed through the convex lens to diverge in such a way as to pass through the plurality of optical filters.

4. The imaging system according to claim 1,
wherein the plurality of optical filters are a plurality of color filters,
the random optical filter array has the plurality of color filters randomly arranged therein, and
the image data is color image data.

5. The imaging system according to claim 1,
wherein a piece of the image data is expressed by a signal in which a wavelength band of light is divided into four or more regions.

6. The imaging system according to claim 1,
wherein the generation circuit generates the image data using a compressed sensing technique.

7. The imaging system according to claim 1,
wherein artifacts of the image data are less than artifacts of second image data based on the second sampling matrix and second digital data obtained using the second random optical filter array.

8. An imaging device, comprising:
a random optical filter array that has a plurality of concave lenses and a plurality of optical filters having different transmission characteristics;
a photodiode that receives light that has passed through the random optical filter array; and
an AD converter that converts the light received by the photodiode into digital data,
wherein the plurality of concave lenses are located between the plurality of optical filters and the photodiode, or the plurality of optical filters are located between the plurality of concave lenses and the photodiode, wherein the digital data and modulation information of the random optical filter array are used to generate image data, wherein the modulation information is a sampling matrix, wherein $[y_1\ y^2\ \ldots\ y_n]^T = A\ [x_{1,1}\ x_{1,2}\ \ldots\ x_{1,m}\ \ldots\ x_{n,1}\ x_{n,2}\ \ldots\ x_{n,m}]^T$, wherein the digital data is the $[y_1\ y_2\ \ldots\ y_n]^T$, the image data is the $[x_{1,1}\ x_{1,2}\ \ldots\ x_{1,m}\ \ldots\ x_{n,1}\ x_{n,2}\ \ldots\ x_{n,m}]^T$, the sampling matrix is the A, and wherein the sampling matrix is different from a second sampling matrix for a second random optical filter array having the plurality of optical filters and not having the plurality of concave lenses.

9. The imaging device according to claim 8, wherein artifacts of the image data are less than artifacts of second image data based on the second sampling matrix and second digital data obtained using the second random optical filter array.

10. An imaging system, comprising:

a random optical filter array that has a plurality of concave lenses and a plurality of optical filters having different transmission characteristics;

a photodiode that receives light that has passed through the random optical filter array;

an AD converter that converts the light received by the photodiode into digital data; and a generation circuit that generates image data using the digital data and modulation information of the random optical filter array, wherein the plurality of concave lenses are located between the plurality of types of optical filters and the photodiode, or the plurality of optical filters are located between the plurality of concave lenses and the photodiode, wherein the modulation information is a sampling matrix, and wherein the sampling matrix is different from a second sampling matrix for a second random optical filter array having the plurality of optical filters and not having the plurality of concave lenses.

11. An imaging device, comprising:

a random optical filter array that has a plurality of concave lenses and a plurality of optical filters having different transmission characteristics;

a photodiode that receives light that has passed through the random optical filter array; and an AD converter that converts the light received by the photodiode into digital data, wherein the plurality of concave lenses are located between the plurality of optical filters and the photodiode, or the plurality of optical filters are located between the plurality of concave lenses and the photodiode, wherein the digital data and modulation information of the random optical filter array are used to generate image data, wherein the modulation information is a sampling matrix, and wherein the sampling matrix is different from a second sampling matrix for a second random optical filter array having the plurality of optical filters and not having the plurality of concave lenses.

12. An imaging system, comprising:

a random optical filter array that has a plurality of concave lenses and a plurality of optical filters having different transmission characteristics;

a photodiode that receives light that has passed through the random optical filter array;

an AD converter that converts the light received by the photodiode into digital data; and a generation circuit that generates image data using the digital data and modulation information of the random optical filter array, wherein the plurality of concave lenses are located between the plurality of types of optical filters and the photodiode, or the plurality of optical filters are located between the plurality of concave lenses and the photodiode, wherein the modulation information relates to a point-spread function corresponding to the plurality of concave lenses.

13. An imaging device, comprising:

a random optical filter array that has a plurality of concave lenses and a plurality of optical filters having different transmission characteristics;

a photodiode that receives light that has passed through the random optical filter array; and an AD converter that converts the light received by the photodiode into digital data, wherein the plurality of concave lenses are located between the plurality of optical filters and the photodiode, or the plurality of optical filters are located between the plurality of concave lenses and the photodiode, wherein the digital data and modulation information of the random optical filter array are used to generate image data, and wherein the modulation information relates to a point-spread function corresponding to the plurality of concave lenses.

* * * * *